United States Patent
Bartley et al.

(10) Patent No.: US 7,660,942 B2
(45) Date of Patent: *Feb. 9, 2010

(54) DAISY CHAINABLE SELF TIMED MEMORY CHIP

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew Benson Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 533 days.

This patent is subject to a terminal disclaimer.

(21) Appl. No.: 11/459,997

(22) Filed: Jul. 26, 2006

(65) Prior Publication Data

US 2008/0028161 A1    Jan. 31, 2008

(51) Int. Cl.
*G06F 13/00* (2006.01)
(52) U.S. Cl. .................. 711/104; 711/167; 365/191
(58) Field of Classification Search .......... 711/104, 711/167; 365/191
See application file for complete search history.

(56) References Cited

U.S. PATENT DOCUMENTS

| 5,157,635 | A |   | 10/1992 | Ellis et al. |
|---|---|---|---|---|
| 5,283,764 | A | * | 2/1994 | Kim et al. ............... 365/222 |
| 6,023,440 | A | * | 2/2000 | Kotani et al. ........... 365/230.03 |
| 6,173,345 | B1 |   | 1/2001 | Stevens |
| 6,392,957 | B1 |   | 5/2002 | Shubat et al. |
| 6,502,161 | B1 |   | 12/2002 | Perego et al. |
| 6,658,523 | B2 |   | 12/2003 | Janzen et al. |
| 6,774,734 | B2 |   | 8/2004 | Christensen et al. |
| 7,269,088 | B2 |   | 9/2007 | Osborne |
| 2004/0042333 | A1 | * | 3/2004 | Shore et al. ............... 365/236 |
| 2004/0148482 | A1 |   | 7/2004 | Grundy et al. |
| 2005/0235090 | A1 |   | 10/2005 | Lee et al. |
| 2006/0041730 | A1 |   | 2/2006 | Larson |
| 2006/0090112 | A1 |   | 4/2006 | Cochran et al. |
| 2007/0083701 | A1 |   | 4/2007 | Kapil |
| 2007/0258491 | A1 |   | 11/2007 | Reitlingshoefer et al. |

OTHER PUBLICATIONS

Chai Vaidya, Phase-Locked Loop Based Clock Generators, Jun. 1995, National Semiconductor Corporation, Application note 1006, pp. 1-6.*
Preparing for FB-DIMM and DDR2—Application Overview, pp. 1-8 http:/www.tektronix.com/memory.
Kilbuck, Kevin; "Fully Buffered DIMM—Unleashing Server Capacity", May 25, 2005.

* cited by examiner

*Primary Examiner*—Christian P Chace
*Assistant Examiner*—Jared I Rutz
(74) *Attorney, Agent, or Firm*—Robert R. Williams

(57) ABSTRACT

A memory chip suitable for use in a daisy chain of memory chips. Timing of an array on the memory chip is dynamically determined by circuitry on the memory chip that tracks an access timing of the array. The memory chip is configured to receive an address/command word, determine if the address/command word is directed to the memory chip. If so, the array on the memory chip is accessed according to the address command word. If the address/command word is not directed to the memory chip, the memory chip re-drives the address/command word from an output of the memory chip.

19 Claims, 23 Drawing Sheets

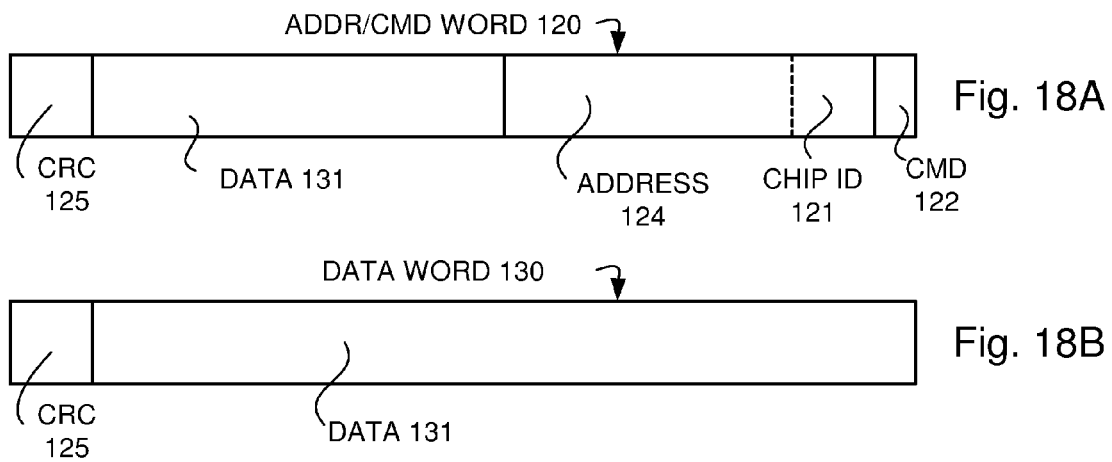
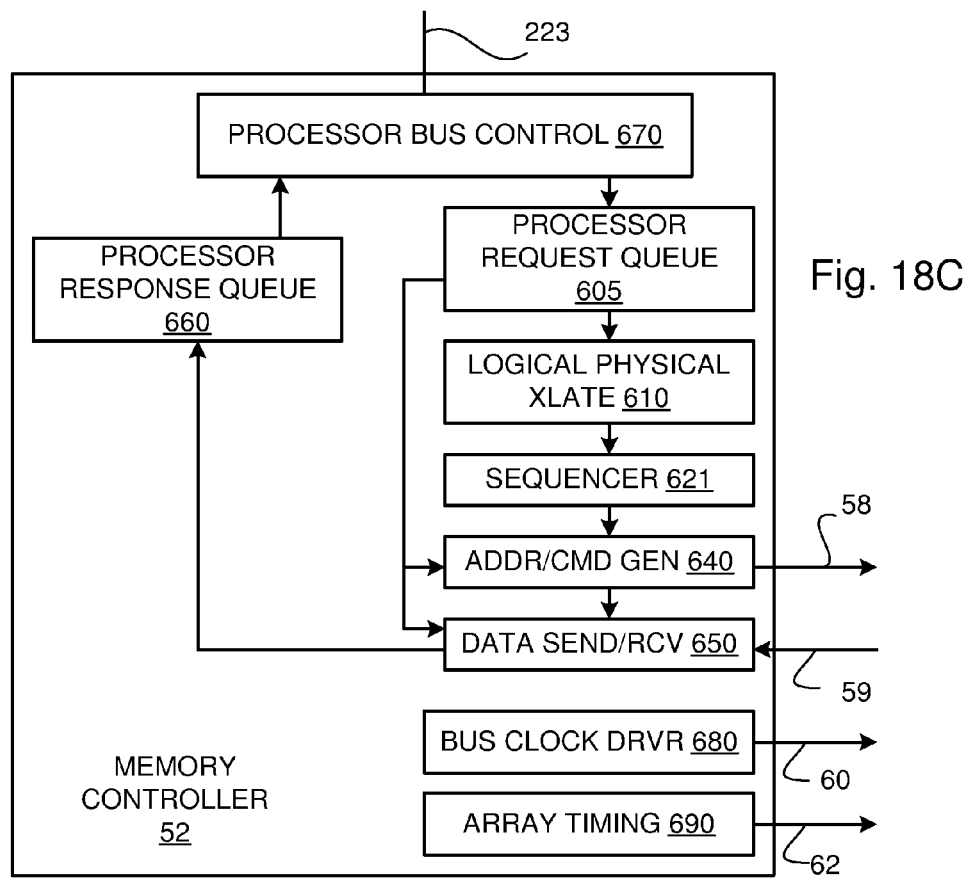

DAISY CHAINABLE SELF TIMED MEMORY CHIP

CROSS-REFERENCE TO RELATED APPLICATIONS

This application is related to:

U.S. application Ser. No. 11/459,956, filed on Jul. 26, 2006, entitled Daisy Chained Memory System, granted May 18, 2008 as U.S. Pat. No. 7,345,900.

U.S. application Ser. No. 11/459,957, filed on Jul. 26, 2006, entitled Memory System Having Self Timed Daisy Chained Memory Chips, granted Jun. 9, 2009 as U.S. Pat. No. 7,545,664.

U.S. application Ser. No. 11/459,969, filed on Jul. 26, 2006, entitled Carrier Having Daisy Chained Memory Chips.

U.S. application Ser. No. 11/459,983, filed on Jul. 26, 2006, entitled Carrier Having Daisy Chain of Self Timed Memory Chips.

U.S. application Ser. No. 11/459,994, filed on Jul. 26, 2006, entitled Daisy Chainable Memory Chip, granted Mar. 11, 2008 as U.S. Pat. No. 7,342,816. A CIP, U.S. application Ser. No. 11/872,108, filed on Oct. 15, 2007, entitled Daisy Chainable Memory chip, granted Jan. 20, 2009 as U.S. Pat. No. 7,480,201.

U.S. application Ser. No. 11/459,974, filed on Jul. 26, 2006, entitled Computer System Having Daisy Chained Memory Chips.

U.S. application Ser. No. 11/459,968, filed on Jul. 26, 2006, entitled Computer System Having Daisy Chained Self Timed Memory Chips. Granted Mar. 18, 2008 as U.S. Pat No. 7,345,901.

U.S. application Ser. No. 11/459,966, filed on Jul. 26, 2006, entitled Memory Controller For Daisy Chained Memory Chips.

U.S. application Ser. No. 11/459,961, filed on Jul. 26, 2006, entitled Memory Controller For Daisy Chained Self Timed Memory Chips, received Notice of Allowance dated Apr. 10, 2009, granted Aug. 18, 2009 as U.S. Pat. No. 7,577,811.

U.S. application Ser. No. 11/459,943, filed on Jul. 26, 2006, entitled Memory Chip Having an Apportionable Data Bus.

U.S. application Ser. No. 11/459,947, filed on Jul. 26, 2006, entitled Self Timed Memory Chip Having an Apportionable Data Bus, granted Jun. 9, 2009 as U.S. Pat. No. 7,546,410.

U.S. application Ser. No. 11/459,955, filed on Jul. 26, 2006, entitled Computer System Having an Apportionable Data Bus.

U.S. application Ser. No. 11/459,959, filed on Jul. 26, 2006, entitled Memory System Having an Apportionable Data Bus and Daisy Chained Memory Chips, granted Feb. 10, 2009 as U.S. Pat. No. 7,490,186.

BACKGROUND OF THE INVENTION

1. Field of the Invention

This invention relates generally to memory systems and memory interconnections in electronic systems. More particularly, the invention relates to high speed interconnection of daisy-chained memory chips.

2. Description of the Related Art

Modern computer systems typically are configured with a large amount of memory in order to provide data and instructions to one or more processors in the computer systems.

Historically, processor speeds have increased more rapidly than memory access times to large portions of memory, in particular, DRAM memory (Dynamic Random Access Memory). Memory hierarchies have been constructed to reduce the performance mismatches between processors and memory. For example, most modern processors are constructed having an L1 (level 1) cache, constructed of SRAM (Static Random Access Memory) on a processor semiconductor chip. L1 cache is very fast, providing reads and writes in only one, or several cycles of the processor. However, L1 caches, while very fast, are also quite small, perhaps 64 KB (Kilobytes) to 256 KB. An L2 (Level 2) cache is often also implemented on the processor chip. L2 cache is typically also constructed of SRAM design, although some processors utilize DRAM design. The L2 cache is typically several times larger in number of bytes than the L1 cache, but is slower to read or write. Some modern processor chips also contain an L3 (Level 3) cache. L3 cache is capable of holding several times more data than the L2 cache. L3 cache is sometimes constructed with DRAM design. L3 cache in some computer systems is implemented on a separate chip or chips from the processor, and is coupled to the processor with wiring on a printed wiring board (PWB) or a multi chip module (MCM). Main memory of the computer system is typically large, often many GB (gigabytes) and is typically implemented in DRAM.

Main memory is typically coupled to a processor with a memory controller. The memory controller receives load (read) commands and store (write) commands from the processor and services those commands, reading data from main memory or writing data to main memory. Typically, the memory controller has one or more queues (e.g., read queues and write queues). The read queues and write queues buffer information (e.g., commands, addresses, data) so that the processor can have multiple read and/or write requests in progress at a given time.

In various implementations, signaling between the memory controller and the memory chips comprise multidrop connections. That is, a pin on the memory controller connects directly to a plurality of memory chip pins (e.g., DRAM chip input or output or common I/O connection) It will be understood that typically one memory chip is placed on one module, so the connection to a particular memory chip includes a module pin plus the chip pin. Occasionally, several memory chips are placed on a single module which creates multiple drops even on a single module.

Another approach uses point to point interconnections between the memory controller and a buffer chip, the buffer chip being associated with a number of memory chips and accessing (writing/reading) to/from those associated chips when the buffer chip receives an address on the point to point interconnect from the memory controller. If the address received does not address the memory chips associated with the buffer chip, the buffer chip re-drives the command/address, and perhaps data, to another buffer chip.

FIG. 1 illustrates such a prior art memory structure. Memory controller 12 is coupled to a first point to point interconnection 18A, comprising "M" bits to a first buffer chip 20A. First point to point interconnection 18A carries address and command information. Memory controller 12 is coupled to a second point to point interconnection 19A, comprising "N" bits, to the first buffer chip 20A. Buffer chip 20A is mounted on a carrier 16A. Also shown mounted on carrier 16A are eight memory chips 14. Buffer chip 20A, as described above, receives address and command information on first point to point interconnect 18A. If buffer chip 20A determines that the address received addresses data in an address space of carrier 16A, buffer chip 20A drives address and control information on multidrop interconnection 21A. Data is typically sent on multiple, point to point interconnections between buffer chip 20A and memory chips 14 as shown on point to point connections 22 (four such point to point connections are referenced with numeral 22, for simplicity, others are not explicitly referenced). If, however, buffer chip 20A determines that the address received on first point to point interconnect 18A does not address the address space of carrier 16A, buffer chip 20A retransmits the address and command on point to point interconnect 18B to a second buffer chip 20B. Buffer chip 20B is mounted on carrier 16B and is coupled to memory chips 14 on carrier 16B. If buffer chip 20B determines that the address is not for an address space of carrier 16B, buffer chip 20B further re-drives the address and command on point to point interconnect 18C to a third buffer chip (not shown). If buffer chip 20B determines that the address is for the address space of carrier 16B, buffer chip 20B drives address and control information on multidrop interconnection 21B.

Data is sent, as described above, on point to point interconnections 22 between buffer chip 20B and memory chips 14 on carrier 16B (as before, four point to point connections 22 shown referenced). Thus, the address and command data is "daisy-chained" from one buffer chip 20 to another, with the appropriate buffer chip reading or writing data from/onto point to point interconnects 19 (shown as 19A-19C in FIG. 1). A problem with this approach is that buffer chips are required. Buffer chip 20 takes up area on carrier 16, and dissipates power. In electronic packaging and system design, area and power consumption are typically desired to be minimized. Buffer chips also add cost to a memory system. Yet another problem in this implementation is that a first period of time (one or more cycles) is used to drive the address and command to a buffer chip and a second period of time (one or more cycles) is then used to drive the address on a carrier (e.g., carrier 16). Driving signals on carrier interconnect, such as copper wiring on a printed wiring board (PWB) requires significant area on the buffer chip for the off chip driver, and associated ESD (electrostatic discharge) circuitry. Ensuring that the chip—module—carrier—module—chip path is operational, and providing for diagnosis of faulty signaling paths, also often requires that some or all pins be driven by a common I/O circuit that can both drive and receive, thus increasing the size and complexity of the circuitry that drives (or receives).

Therefore, there is a need for further improvement in a fast and efficient memory system.

SUMMARY OF THE INVENTION

The present invention provides a self timed memory chip suitable for use in a memory system having a daisy chain of memory chips. The self timed memory chip is configured to receive an address/command word, and determine if the address/command word is directed to the self timed memory chip. If so, the self timed memory chip performs a command included in the address/command word, such as a read or a write to an array on the self timed memory chip. If not, the self timed memory chip is configured to re-drive the address/command word on an output of the self timed memory chip.

The self timed memory chip is configured to receive a write data at a first data bus port. If the write data is directed to the self timed memory chip, the self timed memory chip is configured to write the write data into an array on the self timed memory chip. If the write data is not directed to the self timed memory chip, the self timed memory chip is configured to re-drive the write data from a second data bus port. The self timed memory chip is further configured to receive read data from the second data bus port. The self timed memory chip is configured to select the read data read from the second data bus port or read data read from the array on the self timed memory chip and transmit the selected read data onto the first data bus port.

Access timing of the array on the self timed memory chip is controlled by a self time block on the self timed memory chip. The self time block determines one or more access timings at which the array will operate and controls the access timing of the array to operate at or near the determined access timing. In an embodiment, a ring oscillator that tracks an access of the array is used to determine the access timing. In an embodiment, a bit line configured to be charged and discharged is part of the ring oscillator.

BRIEF DESCRIPTION OF THE DRAWINGS

FIG. 18A illustrates an address/command word in which the chip ID is a portion of the address. No packet ID is implemented.

FIG. 18B illustrates a data word having no packet ID.

FIG. 18C illustrates a memory controller that drives address/command words timed to ensure that no collisions occur on the data bus chain.

DETAILED DESCRIPTION OF THE PREFERRED EMBODIMENTS

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The present invention provides a self timed memory chip suitable for use in a memory system having a daisy chain of memory chips. The self timed memory chip is configured to receive an address/command word, determine if the address/command word is directed to the self timed memory chip. If so, the self timed memory chip performs a command included in the address/command word, such as a read or a write to an array on the self timed memory chip. If not, the self timed memory chip is configured to re-drive the address/command word on an output of the self timed memory chip.

The self timed memory chip is configured to receive a write data at a first data bus port. If the write data is directed to the self timed memory chip, the self timed memory chip is configured to write the write data into an array on the self timed memory chip. If the write data is not directed to the self timed memory chip, the self timed memory chip is configured to re-drive the write data from a second data bus port. The self timed memory chip is further configured to receive read data from the second data bus port. The self timed memory chip is configured to select the read data read from the second data bus port or read data read from the array on the self timed memory chip and transmit the selected read data onto the first data bus port.

Access timing of the array on the self timed memory chip is controlled by a self time block on the self timed memory chip. The self time block determines one or more access timings at which the array will operate and controls the access timing of the array to operate at or near the determined access timing. In an embodiment, a ring oscillator that tracks an access of the array is used to determine the access timing. In an embodiment, a bit line configured to be charged and discharged is part of the ring oscillator.

Figure 1:
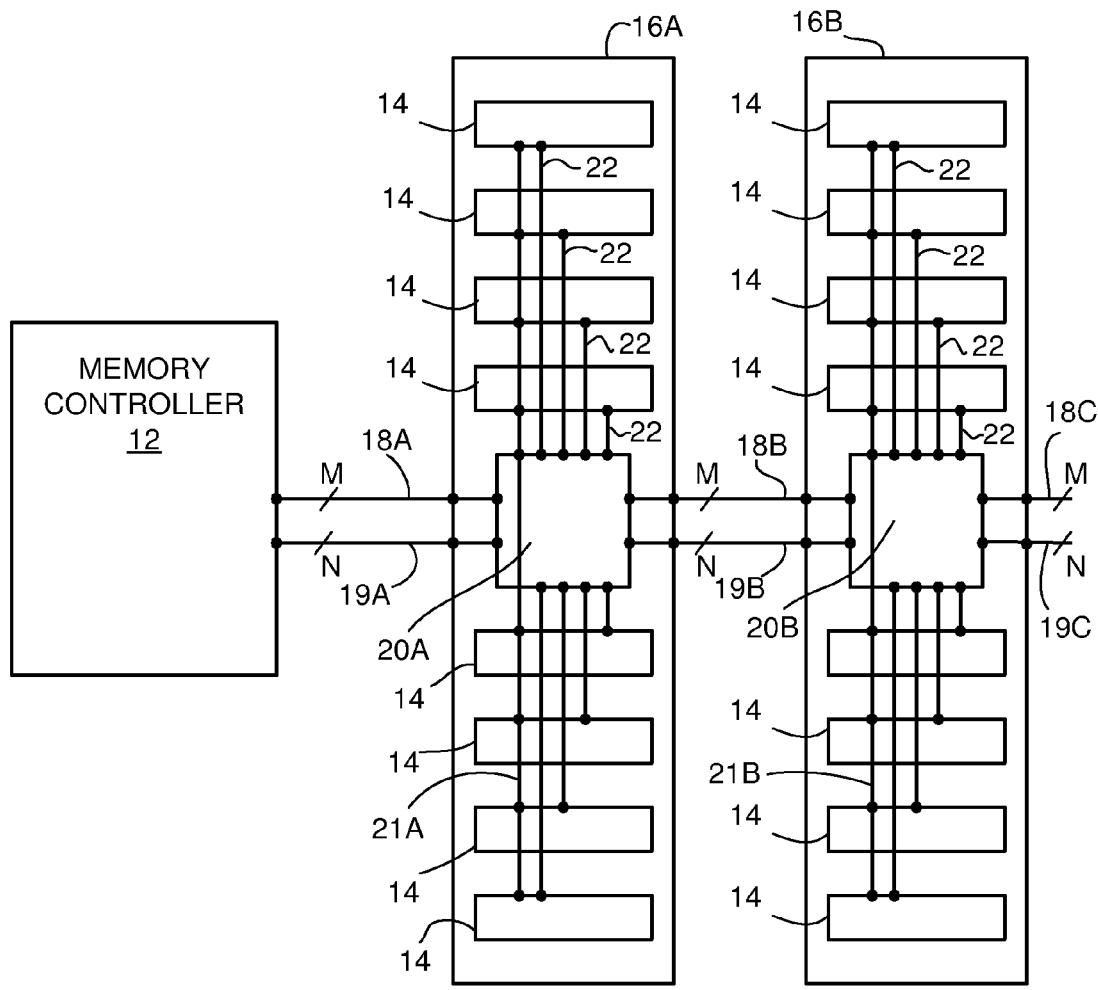
FIG. 1 is prior art drawing of a memory controller and two memory carriers, each memory carrier having a buffer chip and a plurality of memory chips.
Figure 2:
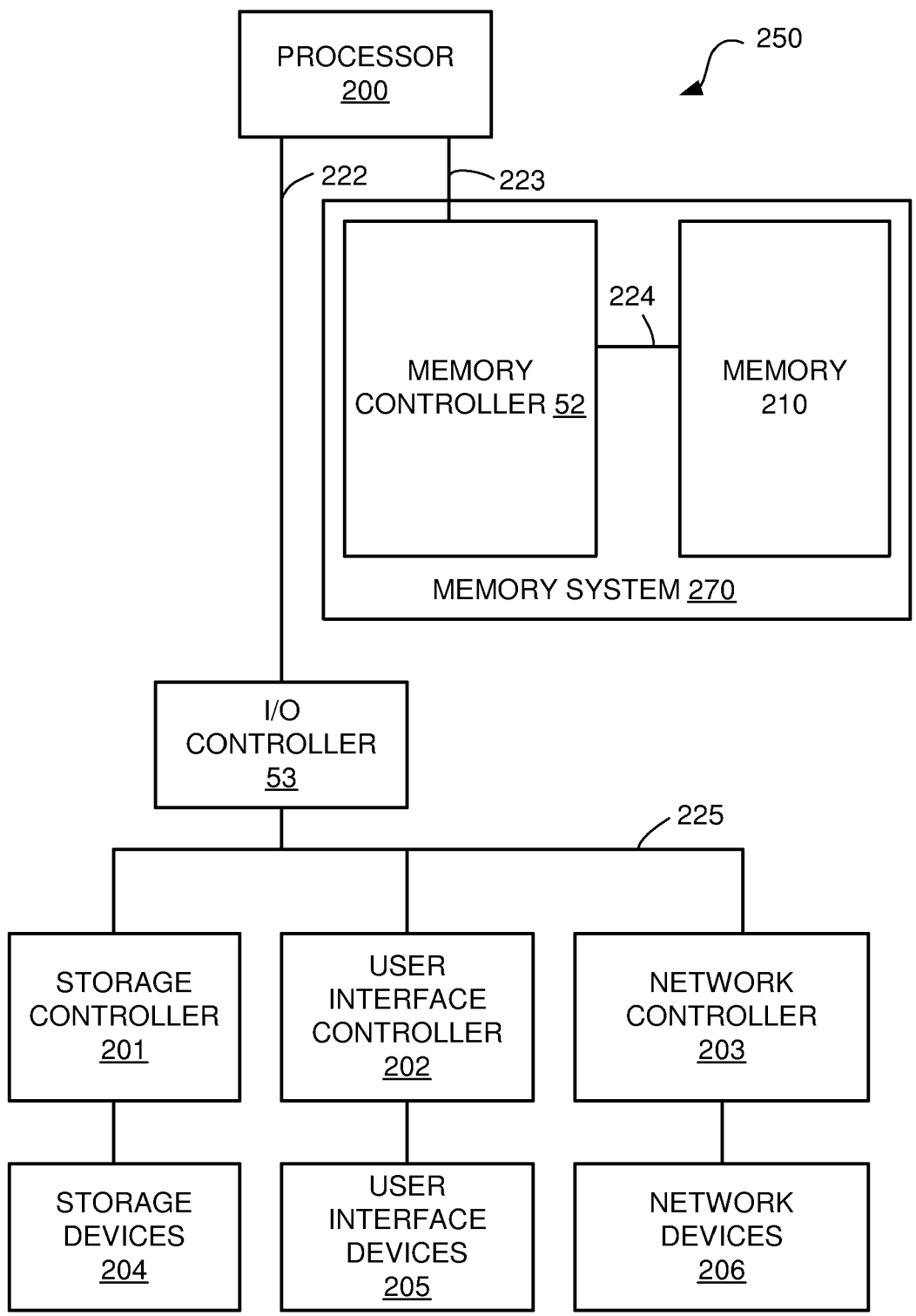
FIG. 2 is a high level block diagram of a computer system embodying the present invention

Turning now to FIG. 2, an exemplary computer system 250 having an embodiment of the present invention is shown in block form sufficient for an understanding of computer system 250. A processor 200 is coupled by bus 223 to a memory controller 52 in a memory system 270. Processor 200 issues fetch and store commands via bus 223 to memory controller 52, including address information of what memory locations to store to or fetch from. Memory controller 52 processes the fetch and store commands, doing any required logical to physical address translations, determining which chip in a daisy chain of memory chips is to be used to handle the commands, and fetching/storing data from/to a memory 210 via bus 224. Embodiments of bus 224 will be explained in detail later. Bus 224 is one or more separate busses that send address/command information to memory chips on point to point interconnections and send or receive data from the memory chips on point to point interconnections.

Processor 200 is also coupled to an I/O controller 53 via bus 222. I/O controller 53 serves as a controller for data going to and coming from storage devices such as CDROMs, hard disks, magnetic tapes, and the like; user interface devices such as mice, keyboards, and the like; and network devices such as modems, Ethernet interfaces and the like. Typically, I/O controller 53 is coupled via I/O bus 225 to a storage controller 201 which is further coupled to storage devices 204; to a user interface controller 202 which is further coupled to user interface devices 205; and network controller 203 which is further coupled to network devices 206. Computer system 250 is exemplary only, and it will be understood that often computer systems comprise a plurality of processors, and different computer systems are coupled to storage devices 204, user interface devices 205, and network devices 206 in various alternative interconnection methods.

Figure 3A:
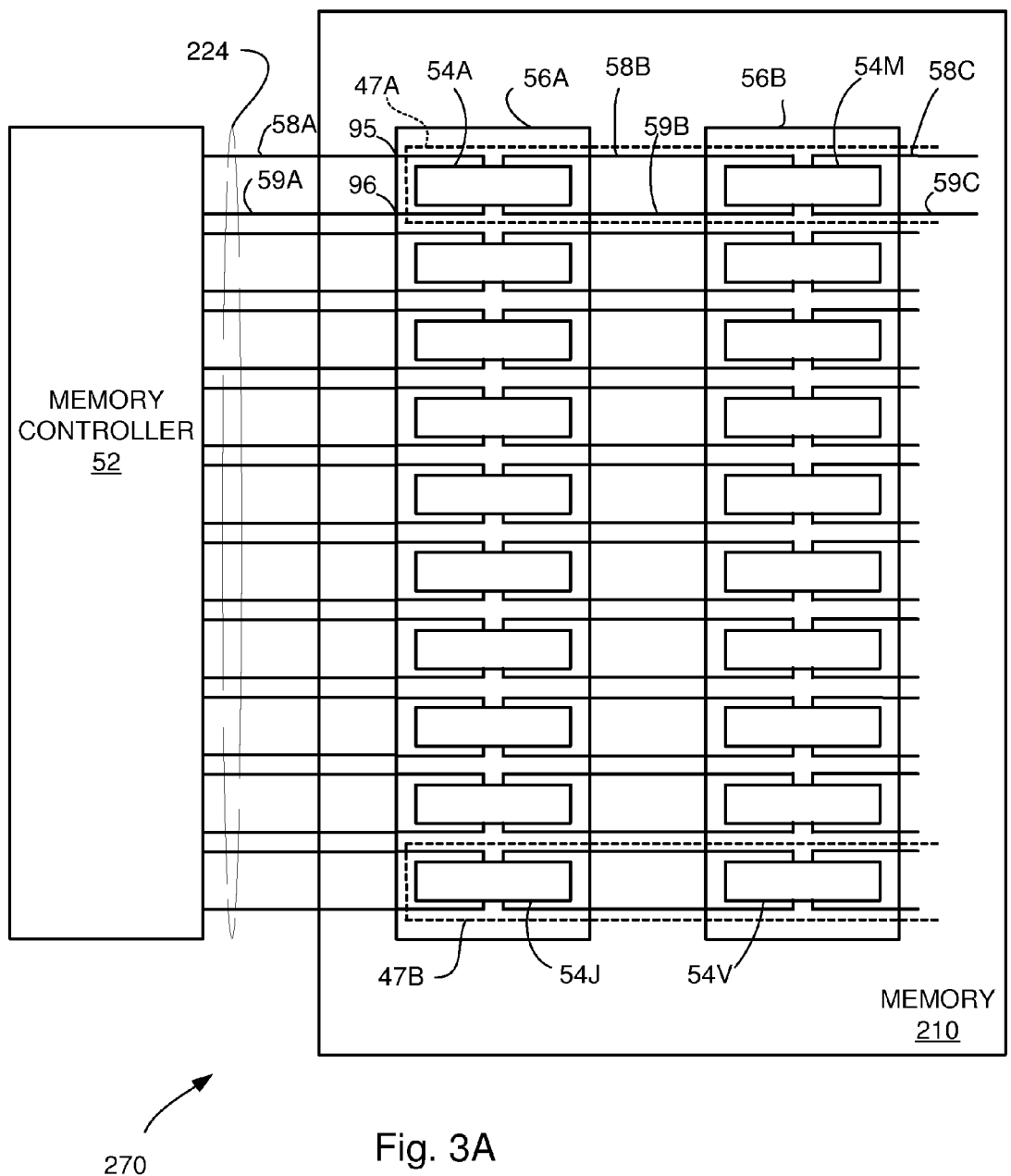
FIG. 3A is a block diagram of a memory system having a memory controller and two memory carriers according to an embodiment of the invention.

FIG. 3A shows memory system 270 with memory controller 52 coupled by bus 224 to memory 210, with memory 210 shown in more detail according to an embodiment of the invention. Bus 224 comprises address/command bus 58 and data bus 59. In an embodiment, address/command bus 58 and data bus 59 interconnect memory controller 52 with daisy chained memory chips 54. For purposes of identification of particular address/command busses 58 and data busses 59, letters are appended to particular address/command busses 58 and data busses 59. Carriers 56 (shown referenced as carrier 56A and carrier 56B) have memory chips 54 attached. Memory chips 54A-54J are attached to carrier 56A; memory chips 54M-54V are attached to carrier 56B. A first daisy chain of memory chips 47A, in FIG. 3A, comprises memory chips 54A, 54M, and any other memory chips 54 serially coupled with memory chips 54A, 54M. Similarly, memory chips 54J, 54V, and any other memory chips 54 serially coupled with memory chips 54A, 54M are a second daisy chain of memory chips 47B, in FIG. 3A. As shown, other "horizontal rows" of memory chips make up other daisy chains of memory chips 47. Generically, a daisy chain of memory chips is denoted by reference numeral "47", suffixed as needed to describe particular daisy chains of memory chips 47. Daisy chains of memory chips 47A and 47B are in dotted boxes having an open end to illustrate possible additional memory chips 54 in each daisy chain of memory chips 47.

In the embodiment depicted in FIG. 3A, address/command bus 58A is received by memory chip 54A. Carrier 56A has an address/command bus off-carrier connector 95 to bring signals on address command bus 58A onto carrier 56A. An address/command bus off-carrier connector 95 is used any time an address/command bus 58 is connected to a portion of an address/command bus link off a carrier 56.

If a particular address/command word (see drawing of address/command word 120 in FIGS. 5A and 5B and description later) driven by memory controller 52 on address/command bus 58A is not directed to (i.e. is not for addresses on) memory chip 54A, memory chip 54A drives the particular address/command word (perhaps modified as will be explained later) on address/command bus 58B to memory chip 54M. If the particular address/command word driven on address/command bus 58B is not for data memory chip 54B, memory chip 54B will drive the particular address/command word on address/command bus 58C to an additional memory chip (not shown). The address/command bus is "chained", that is, each link of the address/command bus couples two memory chips (or the memory controller and a first memory chip in a daisy chain of memory chips). For example, an address/command word, if directed to a fourth memory chip 54 in a daisy chain of memory chips 47 is "chained" along the links of address/command bus 58; that is, driven by the memory controller 52, re-driven by the first memory chip in the daisy chain of memory chips 47, re-driven by the second memory chip in the daisy chain of memory chips 47, and re-driven again by the third memory chip in the daisy chain of memory chips 47. Address/command busses 58 and data busses 59 can be of any number of signal conductors, in various implementations, including only a single signal conductor for address/command busses 58 and data busses 59. Point to point interconnection allows for very high speed data transmission over address/command busses 58, for example, at 5 GHz (gigahertz) bus clock frequency or higher, which supports 10 Gbps (gigabits per second) using DDR (double data rate) techniques.

Similarly, data busses 59 (examples shown as 59A, 59B, 59C) also serially couple memory controller 52 to a memory chip 54 on carrier 56A, with further serial connection to a memory chip on carrier 56B, and so on, for as many memory chips 54 as are implemented in a particular daisy chain of memory chips 47. In an embodiment, data bus 59 comprises a write portion which carries, in a daisy chained manner, data to be written to a memory chip 54 and a read portion which carries, in a daisy chained manner, data back to memory controller 52 from a memory chip 54 in the daisy chain of memory chips 47.

Carrier 56A has a data bus off-carrier connector 96 to bring signals on data bus 59A onto carrier 56A. A data bus off-carrier connector 96 is used any time a data bus 59 is connected to a portion of a data bus link off a carrier 56.

Busses, such as address/command bus 58 and data bus 59 that serially couple interconnection of chips, such as memory controller 52 and memory chips 54 in a daisy chain of memory chips 47 are "chained" busses, each point to point interconnection linking two chips being a "chained bus link".

Figure 3B:
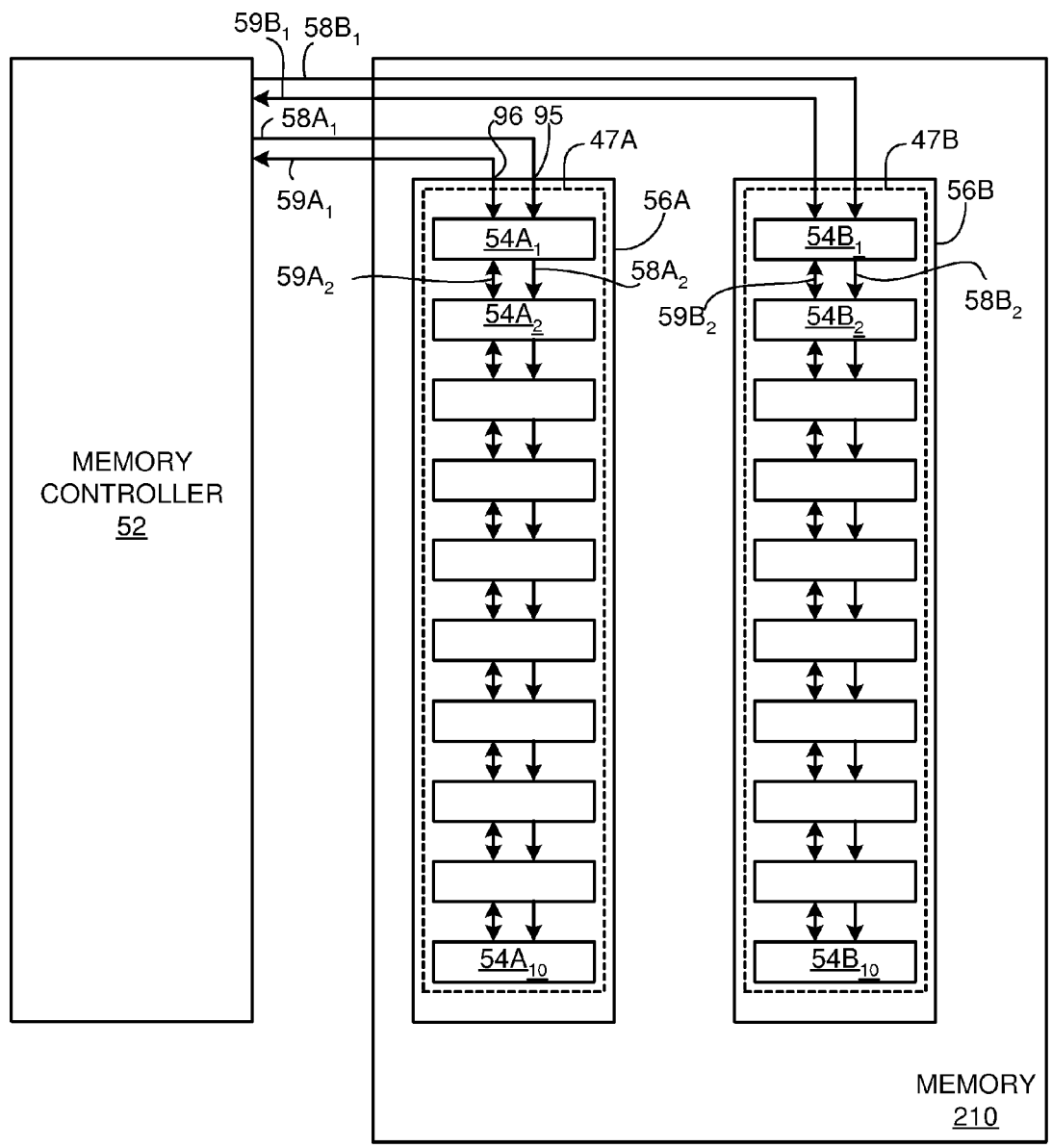
FIG. 3B is a block diagram of a memory system having a memory controller and two memory carriers according to an alternative embodiment of the invention.

FIG. 3B shows an embodiment of memory system 270 comprising memory controller 52 and memory 210. In memory 210 of FIG. 3B, each daisy chain of memory chips 47 (daisy chain of memory chips 47A and 47B are shown, each in a dotted box) is contained on a carrier 56 (shown as carrier 56A and 56B). A first daisy chain of memory chips 47 consists of memory chips $54A_1$ to $54A_{10}$. All memory chips 54 in the first daisy chain of memory chips 47 are attached on carrier 56A. A second daisy chain of memory chips 47 consists of memory chips $54B_1$ to $54B_{10}$. All memory chips 54 in the second daisy chain of memory chips 47 are attached on carrier 56B. In contrast, each daisy chain of memory chips 47 in FIG. 3A included memory chips 54 attached to different carriers 56 (except, of course, in a degenerate case in which a daisy chain of memory chips consists of but a single memory chip 54).

Address/command bus off-carrier connector 95 and data bus off-carrier connector 96 are shown referenced at carrier 56A in FIG. 3B. For simplicity, address/command bus off-carrier connectors and data bus connectors 96 are typically not referenced, for example, at carrier 56B of FIG. 3B.

In FIG. 3B, memory controller 52 drives address/command words 120 (illustrated in FIGS. 5A and 5B and described in reference thereof) on address/command bus $58A_1$ (or on address/command bus $58B_1$). An address/command word 120 from address/command bus $58A_1$ is re-driven by memory chip $54A_1$ on address/command bus $58A_2$ if the address/command word 120 is not directed to memory chip $54A_1$, and, as required, the address/command word 120 is driven down the chain of address/command busses 59 to memory chip $54A_{10}$, as shown. A similar process occurs for address/command words 120 driven on address/command bus $58B_1$, which is re-driven on address/command bus $58B_2$ if the address/command word 120 is not directed to memory chip $54B_1$. Data words 130 (FIG. 7B, 7C) and description thereof are similarly chained on data busses 59A and 59B as needed through the respective daisy chains of memory chips 47A and 47B.

It will be understood that more than a single daisy chain of memory chips 47 can be contained on a single carrier 56.

FIG. 3A and FIG. 3B, for simplicity, do not show clocking signals sent by memory controller 52. A bus clock is required to clock address/command busses 58 and data busses 59. A bus clock will be shown and described later. In addition, arrays on memory chips 54 require timing signals. Embodiments having timing signals transmitted, as well as embodiments having memory chips 54 having self timed arrays are described later.

Figure 4:
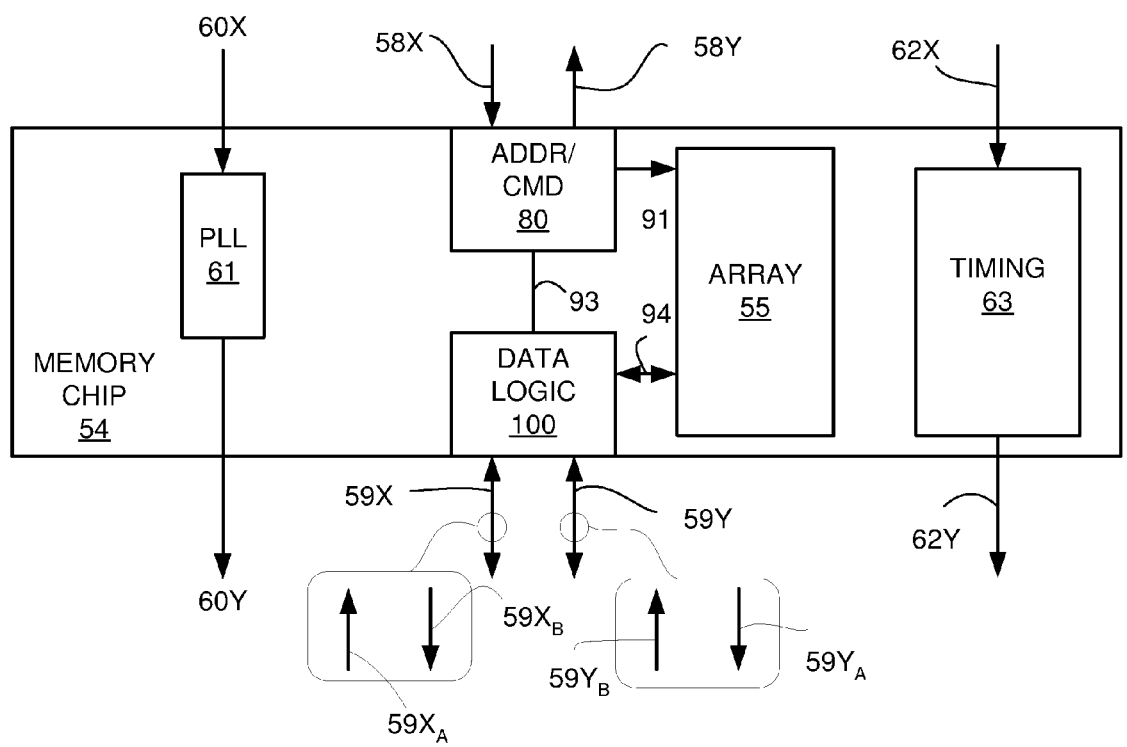
FIG. 4 is a block diagram of a memory chip according to an embodiment of the invention.

FIG. 4 shows additional details of memory chip 54 according to embodiments of the invention. Referring to FIG. 4, memory chip 54 comprises an address/command block 80, a data logic 100, and an array 55. Array 55 is configured to be able to store data, memory chip 54 being able to read data from and write data to, array 55.

Address/command block 80 of an instant memory chip 54 receives address/command words on an address/command bus 58, denoted in FIG. 4 as 58X which was driven by memory controller 52 (FIG. 3) or a memory chip 54 that is upstream in the daisy chain of memory chips 47 (an "upstream" memory chip being positioned closer to memory controller 52). Address/command block 80 is configured to receive a current address/command word on address/command bus 58X, and is further configured to check if the address/command word is for a read or a write in array 55 of the instant memory chip 54. If so, address/command block 80 and data logic 100 are configured to perform the read/write from/to array 55 of the instant memory chip 54. On write commands, memory chip 54 is configured to send read data back on data bus 59X. If the address/command word received on address/command bus 58X is not for the instant memory chip 54, address/command block 80 transmits, perhaps with control modification, the address/command word to another memory chip 54 on address/command bus 58Y.

It will be noted in FIG. 4 that, as data bus 59X and 59Y, in embodiments, carry data in two directions. A first direction carries data sent from memory controller 52 that will be written in a memory chip 54. Data read from a memory chip is carried in a second direction back to memory controller 52. In an embodiment, data bus 59X and data bus 59Y are bidirectional busses. In a bidirectional bus embodiment, a particular chip (memory controller 52 or a memory chip 54) coupled to a particular link in the data bus 59 chain must know when the particular chip can drive the link. Control of bidirectional busses is well known and will not be described further here.

Another embodiment of the invention comprises a data bus 59 having an outgoing (i.e., away from memory controller 52) portion, indicated in the shown expansions of data bus 59 as data bus $59X_A$, and data bus $59Y_A$. Data bus 59, in the embodiment, further comprises an ingoing (i.e., towards memory controller 52) portion, noted as data bus $59X_B$ and $59Y_B$. In other words, subscript "A" in FIG. 4 refers to portions of data bus 59 that carry data words 130 away from memory controller 52; subscript B refers to portions of data bus 59 that carry data words 130 toward memory controller 52.

In an embodiment, data bus 59 comprises "N" bits, apportioned "M" bits to an outgoing portion and "N-M" bits apportioned to an ingoing portion. The apportionment, in an embodiment, is fixed. For example, data bus 59 has 18 bits, with nine bits in the outgoing portion (such as data bus $59X_A$) and nine bits in the ingoing portion (such as data bus $59X_B$). Alternative embodiments allow programmable apportionment of the bits in data bus 59 between an outgoing portion (write portion) and an incoming portion (read portion).

PLL 61 (FIG. 4) receives a bus clock 60 (60X) and re-drives bus clock 60 (60Y) to a subsequent chip in the daisy chain of memory chips 47. PLL 61 uses bus clock 60 to provide timing for signal transmission on address/command bus 58 (58X and 58Y in FIG. 4) and data bus 59 (59X and 59Y in FIG. 4). PLL 61 is a Phase Locked Loop circuit in an embodiment where the bus clock 60 frequency needs to be multiplied to a suitable frequency for data transmission on address/command bus 58 and data bus 59. For example, if data is transmitted at 10 GB/second, double data rate, a 5 GHZ clock is needed by address/command block 80 and data logic 100. If a bus clock 60 frequency is 1 GHZ, PLL 61 multiplies the frequency on bus clock 60 by five. Alternatively, in an embodiment where a frequency on bus clock 60 is the same frequency as data is transmitted on address/command bus 58 and data bus 59, PLL 61 is a simple buffer circuit.

Timing block 63 (FIG. 4) is required on memory chips 54 that do not implement self timing of array 55. Memory chips 54 that do implement self timing of array 55 will be described in detail later. Timing block 63 receives timing signals 62 (62X) that originate from memory control 52 and the timing signals 62 are chained on point to point interconnections through the daisy chain of memory chips 47. For example, timing signals 62 provide timings for precharging bit lines (not shown) in array 55, driving word lines (not shown) in array 55. In general, timings depend on particular implementation of array 55. Timing block 63 re-drives timing signals 62 (62Y) to the next memory chip 54 in the daisy chain of memory chips 47.

In many scientific applications, writes are as common as reads, and advantageously there is an equal apportionment of bandwidth for write data and read data. However, in many commercial applications, reads greatly outnumber writes and a more advantageous apportionment is to provide more bandwidth for read data than for write data. For example, if data bus 59 has 18 bits, an appropriate apportionment may be twelve bits allocated to the incoming (read) portion (data bus $59X_B$) and six bits allocated to the outgoing (write) portion (data bus $59X_A$). Furthermore, because processor 200 is often stalled while waiting for data, reads are usually prioritized over writes; a larger number of bits in data bus 59 should be apportioned to the incoming portion of data bus 59.

In a further embodiment, data logic 100 implements a programmable apportionment of the "N" bits so that a memory chip 54 and a memory controller 52 can be tuned (e.g., by conventional scan data or pin connection) for a computer system 250 that runs a preponderance of scientific applications (with read data bandwidth similar to write data bandwidth) or a preponderance of commercial applications (with read data bandwidth being greater than write data bandwidth). An example showing how data bus 59 is programmably apportioned is given later with reference to FIGS. 7E and 7F.

Figure 5A:
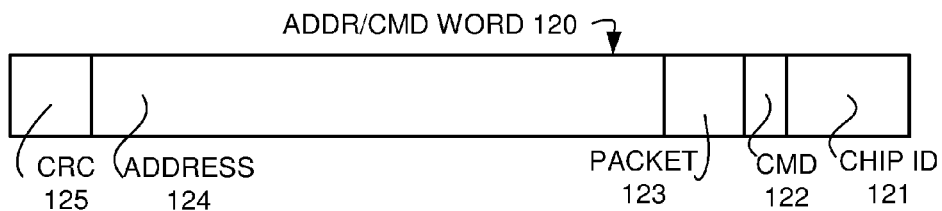
FIG. 5A shows a representative address/command word and its subportions.

FIG. 5A shows an exemplary address/command word 120 transmitted on address/command bus 58. Address/command word 120, in the embodiment shown in FIG. 5A comprises a chip ID 121, a command 122, a packet number 123, and an address 124. Memory controller 52 knows which memory chip 54 in a particular daisy chain of memory chips 47 a particular piece of data is to be written to or read from. Chip ID 121 identifies which memory chip 54 in a particular daisy chain of memory chips 47 the address command word 120 is intended for, and the chip ID 121 is written by memory controller 52 when the address/command word 120 is sent from memory controller 52. Chip ID 121 can be a binary number. For example, if there are eight memory chips 54 in a particular daisy chain of memory chips 47, chip ID 121 has a value "000" if the address/command word 120 is intended for the first memory chip 54; a value "001" if the address/command word 120 is intended for the second memory chip 54, and so on. Each particular memory chip 54, upon receipt of a particular address/command word 120 compares the chip ID 121 in the address/command word 120 against a memory chip ID known to the particular memory chip 54. The memory chip ID, in embodiments, is scanned in through conventional scan techniques at system bring up into each memory chip 54, or can be programmed by way of having pins on each memory chip 54 being coupled to suitable voltages. For example, the first memory chip 54 in a daisy chain of eight memory chips 54 has three memory chip ID pins, all connected to a logical "0". The last memory chip 54 in the daisy chain of eight memory chips 54 has its three memory chip ID pins all connected to a logical "1".

Command 122 is typically a simple "read" or "write" indicator, for example, a logical "0" for read and a logical "1" for a write.

Packet ID 123 is a packet identifier field in an address/command word 120. Packet ID 123 contains a value assigned by memory controller 52 to associate a particular address/command word 120 with a particular data word (to be described later). The size (i.e., number of bits) of packet ID 123 depends, in a particular design, upon how many outstanding read/write requests (commands) memory controller 52 is designed to support on a particular daisy chain of memory chips 47. For example, if memory controller 52 supports sixteen outstanding requests in a daisy chain of memory chips 47, four bits are required. Memory chips 54 may support a larger number of bits (e.g., have an eight bit field available for packet ID 123 data); if so, memory chips 54 will be programmed during bring up to realize that fewer than eight bits are used for packet ID 123 data. Alternatively, memory controller 52 simply transmits (using the example above) four bits of packet ID 123 data, with an additional four bits of padding (e.g., zeros).

Address 124 is the location in the array of memory chip 54 where requested data is to be written to or read from. As with packet ID 123, length of address 124 can be programmable or address bits can be padded by memory controller 52.

CRC 125 is a cyclic redundancy code field used in some embodiments. Implementations requiring CRC for reliability or other reasons include CRC 125. If CRC is not required, CRC 125 is not implemented, or is not filled with valid data or checked for valid data if implemented.

Figure 5B:
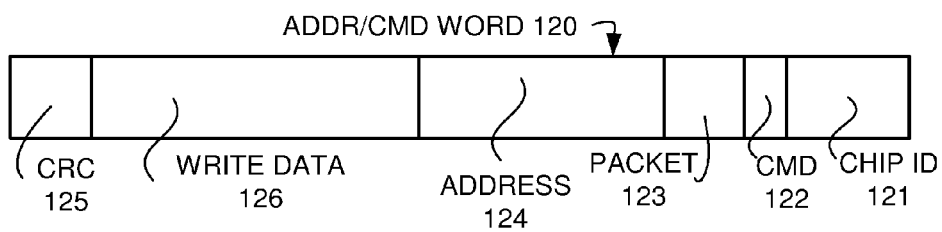
FIG. 5B shows an alternate embodiment of an address/command word and its subportions.

FIG. 5B shows an alternative embodiment of address/command word 120. In alternative embodiments of the invention, data to be written into an array 55 of a memory chip 54 is transmitted with command word 120. Such alternative embodiments eliminate the need for "outgoing" data bus 59 portions, such as $59X_A$ and $59Y_A$, shown in FIG. 4. However, transmitting data to be written into an array 55 significantly increases bandwidth requirements on address/command bus 58, and in such embodiments, address/command bus 58 is typically made wider than embodiments in which data to be written into an array 55 is transmitted on a separate "outgoing" data bus such as $59X_A$ and $59Y_A$, shown in FIG. 4. Address/command word 120 shown in FIG. 5B comprises chip ID 121, command 122, packet ID 123, address 124, and an optional CRC 125 as explained in reference to CRC 125 in address/command word 120 in FIG. 5A, and further comprises write data 126. Unless specified, for simplicity, an address/command word 120 as shown in FIG. 5A will be hereinafter assumed.

Figure 5C:
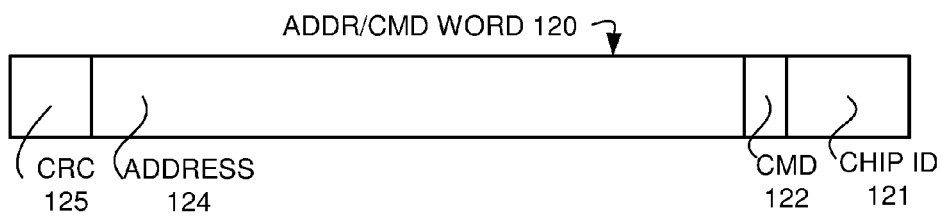
FIG. 5C shows another alternate embodiment of an address/command word and its subportions.

It will be further noted that, in FIG. 5C, no packet 123 is implemented. Whereas in many embodiments of the invention to be described later, packet 123 is required to identify which data word 130 is associated with a particular address/command word 120, in other embodiments, memory controller enforces timing constraints such that ambiguities between data words 130 and address/command words 130 do not exist.

Figure 6A:
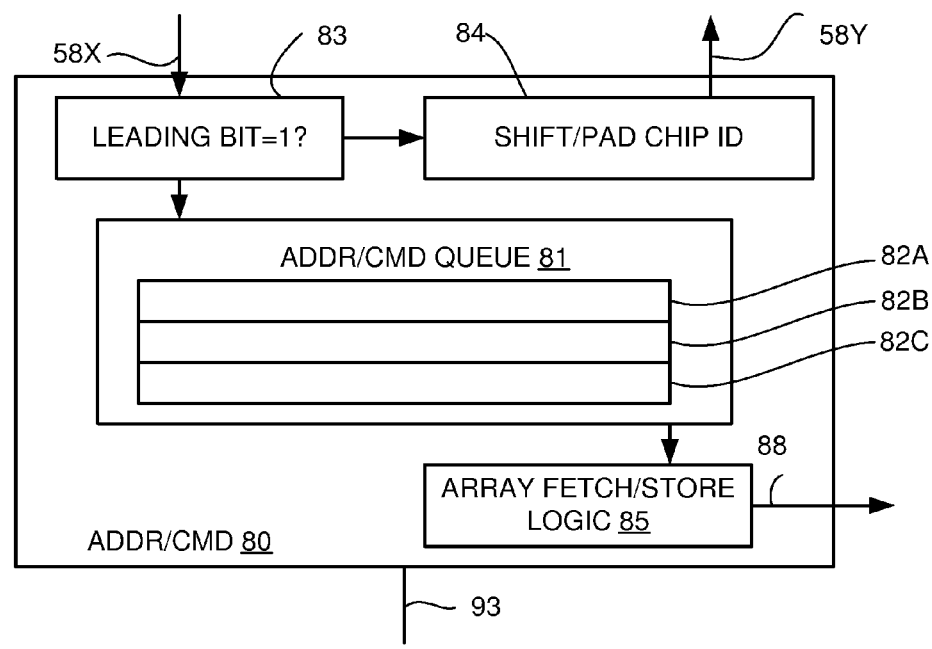
FIG. 6A shows a block diagram of an address/command block, with details therein.
Figure 6B:
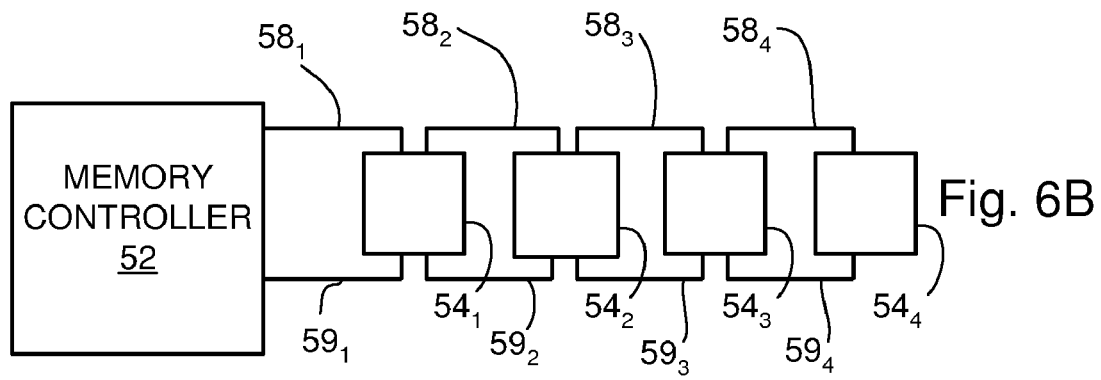
FIG. 6B shows a block diagram of a memory controller and four daisy chained memory chips with bus referencing to be used in FIG. 6C.
Figure 6C:
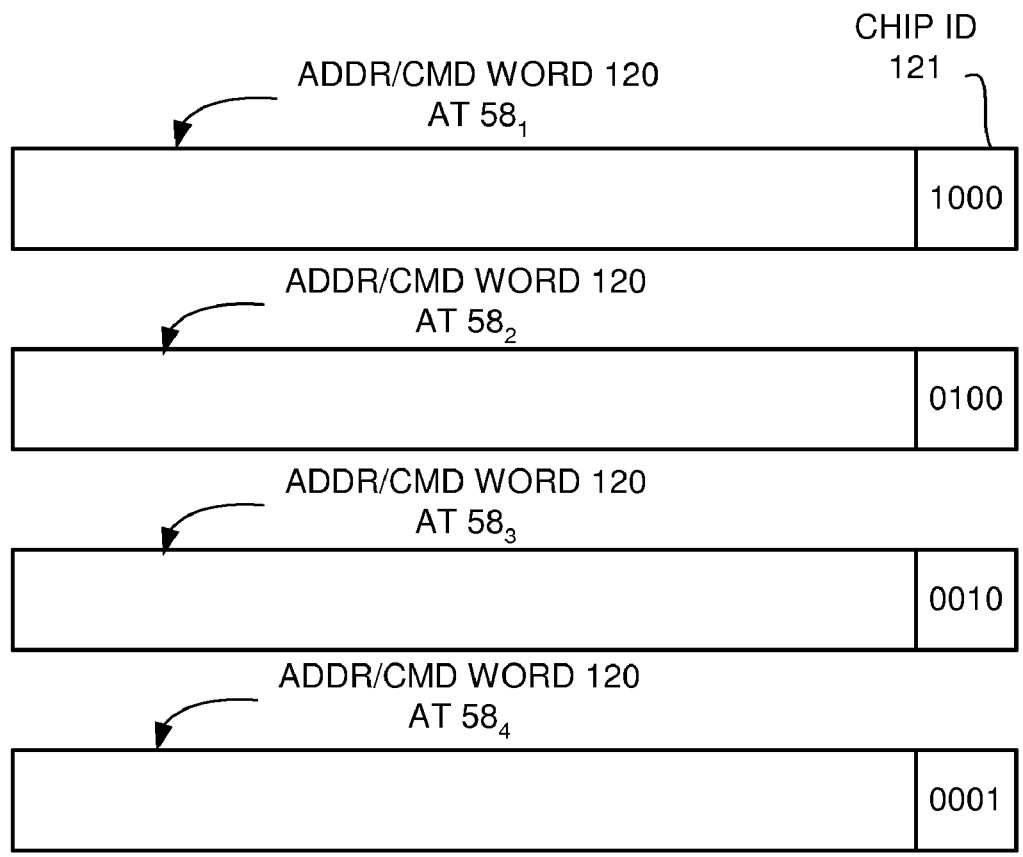
FIG. 6C shows an address/command word that addresses a fourth memory chip in FIG. 6B, and describes how a chip ID value is shifted as the address command word passes through the daisy chained memory chips.
Figure 6D:
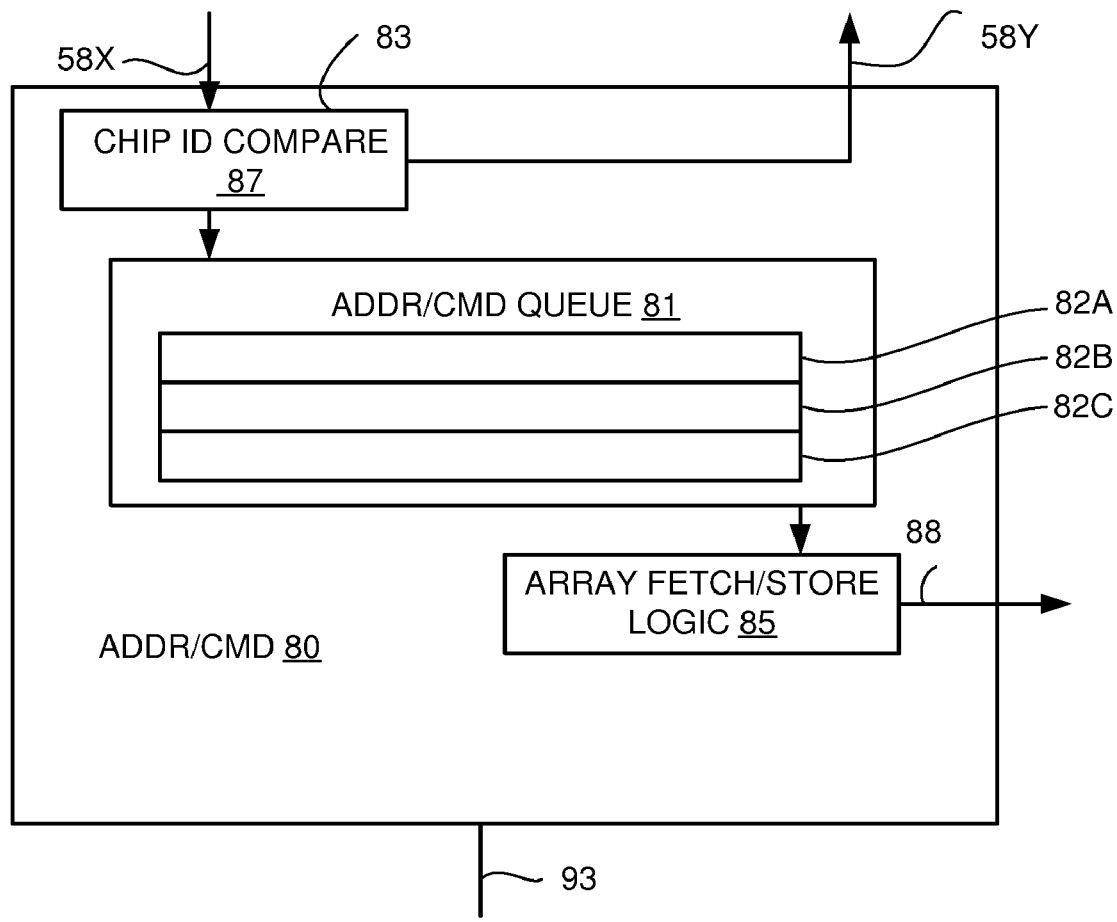
FIG. 6D shows a block diagram of an address/command block according to an alternate embodiment of the invention.

FIGS. 6A-6D illustrate address/command 80 in more detail. FIGS. 6A, 6B, and 6C show an embodiment in which address/command bus 58 is a single bit wide. FIG. 6D shows that in an alternative embodiment, address/command bus 58 contains a plurality of bits, with appropriate logic in address/command 80 in an instant chip configured to recognize when an address/command word 120 is directed to the instant chip.

Referring now to FIG. 6A, address/command block 80 is configured to receive address/command words 120 over address/command bus 58X. As shown in FIG. 5A and 5B, the first bits coming in on an address/command word 120 are the chip ID bits 121. Advantageously in a one-bit-wide address/command bus 58 embodiment where the number of memory chips in a daisy chain is not long (e.g., over about eight memory chips) a "one-hot" implementation of chip ID 121 is used. FIG. 6B shows memory controller 52 and a daisy chain of memory chips 47 having four memory chips 54 ($54_1$-$54_4$). Address/command busses $58_1$-$58_4$ are used to transmit address/command words 120, as shown in FIG. 6B. Data busses $59_1$-$59_4$ are used to send/receive data to/from memory chips $54_1$-$54_4$. In the embodiment shown, a chip ID 121="0001" (where the "1" is the first bit transmitted) sent by memory controller 52 will reference the first memory chip 54 (i.e., memory chip $54_1$) in the daisy chain of memory chips. A chip ID 121 value of "0010" sent by memory controller 52 references the second memory chip 54 in the daisy chain, and so on. In such an embodiment, each particular memory chip 54 will handle the incoming address/command word 120 if the leading bit in the incoming address/command word 120 is "1". Each memory chip 54 shifts the chip ID 121 by one bit.

As shown in FIG. 6A, in address/command block 80, block 83 checks if the leading bit in an address/command word 120 is "1". If so, the address/command word 120 is written into an address/command queue 81. Address/command queue 81 contains one or more address/command buffers 82 (address/command buffers 82A-82C shown).

If the leading bit of the incoming address/command word 120 is not "1", the address/command word 120 is simply routed through a shift/pad chip ID 84 onto address/command bus 58Y, with the bits in chip ID 121 shifted by shift/pad chip ID 84 by one bit to the right, with padding added on the left. For example if memory controller 52 sends an address command word 120 on address command bus 58, (FIG. 6B) having a chip ID 121 value of "0010", the chip ID 121 driven by memory chip $54_1$ onto address/command bus $58_2$ will have a value of "0001", and memory chip $58_2$ will handle the request.

FIG. 6C shows how the contents of chip ID 121 are shifted to the right in an address/command word 120 intended for memory chip $54_4$. This shifting technique allows an instant memory chip 54 to immediately recognize whether a particular address/command word 120 received on a one bit wide address/command bus 58 is directed to the instant memory chip 54 or needs to be passed to the next memory chip 54 in the daisy chain of memory chips 47. If such shifting were not done, the entire contents of the chip ID 121 field would have to be received by an instant memory chip 54 before the instant memory chip 54 would know if the incoming address/command word 120 is directed to the instant memory chip 54 or must be re-driven to the next memory chip 54, causing delays and requiring additional buffering of address/command word 120.

FIG. 6D shows an embodiment of address/command 80 similar to that shown in FIG. 6A except that address/command word is transmitted over an address/command word 58 having more than a single bit. Chip ID compare 87 compares chip ID 121 received on address/command bus 58X against the memory chip ID for the particular memory chip 54. The memory chip ID, in embodiments is scanned into a register (not shown), or programmed using I/O pins (not shown) on the particular memory chip 54. If a chip ID 121 matches the memory chip ID, the address/command word 120 is placed in address/command queue 81; if not, the address/command word is re-driven on address/command bus 58Y.

Embodiments of address/command 80 that shift chip ID that also include CRC 125 must ensure that the value in CRC 125 remains valid. For example, in an embodiment, CRC 125 is regenerated in shift/pad DRAM ID 84. In an alternative embodiment, a value in CRC 125 does not include chip ID 121; that is, CRC generation does not consider chip ID 121.

Array fetch/store logic 85 (FIG. 6A and FIG. 6D) processes commands on memory chip 54 in a conventional manner, using addresses 124 from address/command words 120 in address/command buffers 82 in address/command queue 81. Addresses and other control signals (such as to control bit line precharge, word line enable, etc, depending on particular design details of a particular array 55) are sent to array 55 on signals 88. Signals 93 communicate information to data logic 100 as to whether data is being written to or read from array 55, along with values of each particular packet ID 123 so that data read/written from array 55 is always associated with the particular packet ID 123.

Figure 7A:
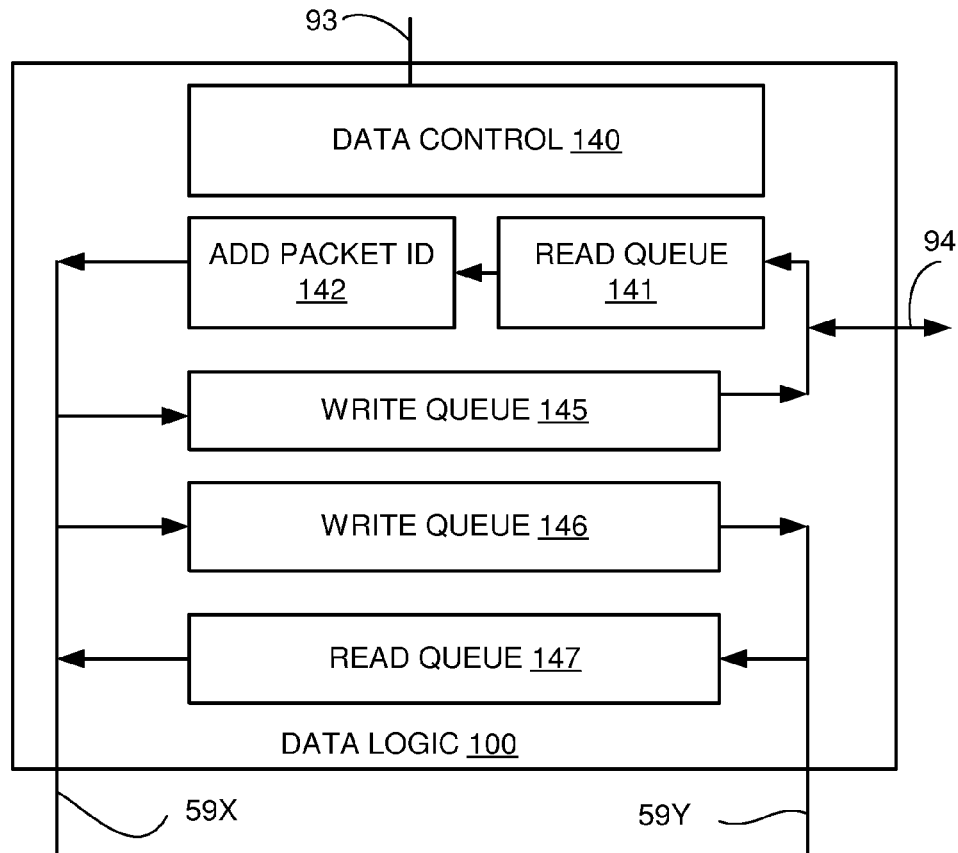
FIG. 7A is a block diagram of a data logic block in a memory chip.
Figure 7B:
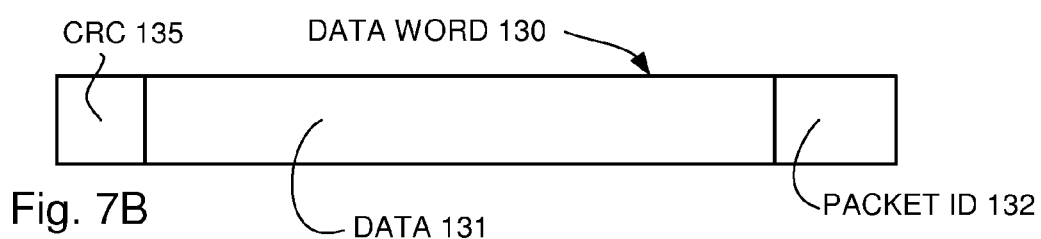
FIG. 7B is an exemplary data word received or sent by the data logic block in the memory chip.

FIG. 7A shows details of an exemplary data logic 100. Data control 140 is in communication with address/command block 80 via signals 93, and further with array 55 via signals 94 (see FIG. 4). Data control 140 manages reads and writes to array 55. For example, if a currently selected address/command word 120 in address/command queue 81 requests data from array 55, data control 140 will cause a read operation to occur to array 55. When the data read is received from array 55, the data is routed on signals 94 to read queue 141. The associated packet value from the packet ID 123 of the selected address/command word 120 is appended to the data received from array 55 in an add packet ID 142, forming a data word 130, as shown in FIG. 7B. A data word 130 comprises a data portion 131 and a packet ID portion 132 as shown in FIG. 7B.

A data word 130 containing data 131 that has been read from an array 55 in a memory chip 54 is called a read data word. A data word 130 containing data 131 that is to be written into an array 55 in a memory chip 54 is called a write data word.

As with address/command word 120, in embodiments, a CRC 135 portion is included in data word 130 and contains cyclic redundancy code information to enhance reliability of data transmission. In embodiments implementing CRC 135, generation of a CRC value for a particular data word 130 is performed in add packet ID 142.

If a write operation is indicated by the currently selected address/command word 120, write queue 145 is checked for a packet ID 132 in write queue 145 that matches the packet ID 123 of the address/command word 120. If found, data 131 from a data word 130 having the matching packet ID 132 is written to the address 124 of the currently selected address/command 120 word. If the packet ID 123 is not matched in write queue 145, data control 140 waits for a predetermined time interval, during which data control 140 can service other address/command words 120. If, after the predetermined time interval, a packet ID match between a particular packet ID 120 and any packet ID in write queue 145 is not successful, an error may be reported back to memory controller 52. For example, packet ID 132, in an embodiment, contains one more bit than packet ID 123. The extra bit is set to "1", and the packet ID 123 value is sent back to memory control 52 in the remainder of packet ID 132, on data bus 59X. Memory controller 52, upon receipt of a data word 130 containing a "1" in the extra bit of the packet ID 132 knows that the data sent for that packet was not successfully written into a memory chip 54. As before, in an embodiment as illustrated in FIG. 4A, data bus 59 contains one or more incoming signals, e.g., $59X_A$, and one or more outgoing signals, e.g., $59X_B$.

Data control 140 also manages write queue 146 and read queue 147 shown in FIG. 7A. Write queue 146 contains write data words 130 (FIGS. 7B and 7C) having data destined to be written to memory chips 54 further down the daisy chain of memory chips 47. Read queue 147 contains read data words 130 having data that has been read from memory chips 54 further down the daisy chain of memory chips 47.

As data words 130 arrive on data bus 59X, packet ID 132 values are checked against packet ID 123 values. If a match occurs, the data word 130 is routed to write queue 145; if not matched, the data word 130 is routed to write queue 146 for further transfer to memory chips 54 further down the daisy chain when data bus 59Y is available. A data 131 from a particular data word 130 is written into array 55 when write queue 145 is able to do so (that is, when array 55 is not being otherwise accessed and when whatever priority arbitration mechanism in a particular implementation selects the particular data word from write queue 145.

Similarly, data words 130 are received from data bus 59Y and are routed to read queue 147 and further routed towards memory control 52 when data bus 59X is available for transmitting in the direction of memory controller 52.

Figure 7C:
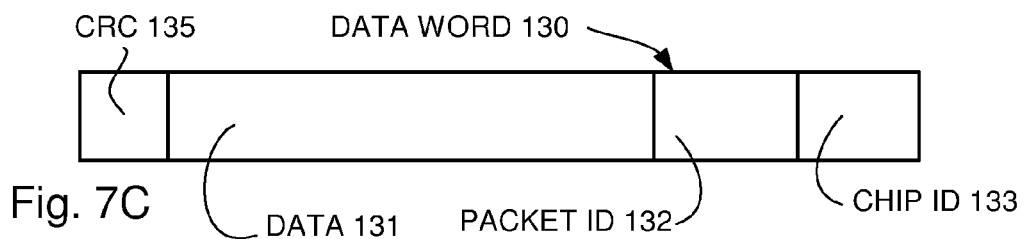
FIG. 7C is an alternative exemplary data word that includes a chip ID field.

Some embodiments of the invention include a chip ID portion of data word which simplifies the task performed by data control 140 on an instant memory chip in determining whether a particular data packet is for the instant memory chip 54. A data word 130 as shown in FIG. 7C comprises data 131, packet ID 132, and chip ID 133. In such an embodiment, data control 140 of an instant memory chip 54 knows a particular data word 130 is directed to that instant memory chip, and does not have to match packet IDs 123 to packet IDs 132 to know whether a particular data word is directed to the instant memory chip 54. Chip ID 133 will have the same value, for a given chip in a daisy chain of memory chips 47, as chip ID 123 in an address/command word 120.

In embodiments, data word 130 in FIG. 7C includes CRC 135 which contains cyclic redundancy code information to enhance data transmission reliability. Chip ID 133 is written by memory controller 52 for write data words 130 having data 131 to be written to a memory chip 54. Chip ID 133 need not be written into by a memory chip 54 when the memory chip 54 writes into a particular read data word 130 since the read data word 130 written into by a memory chip 54 is destined for memory controller 52, not any of the other memory chips 54 in the daisy chain. As above, a value in CRC 135 is generated by add packet ID 142.

Figure 7D:
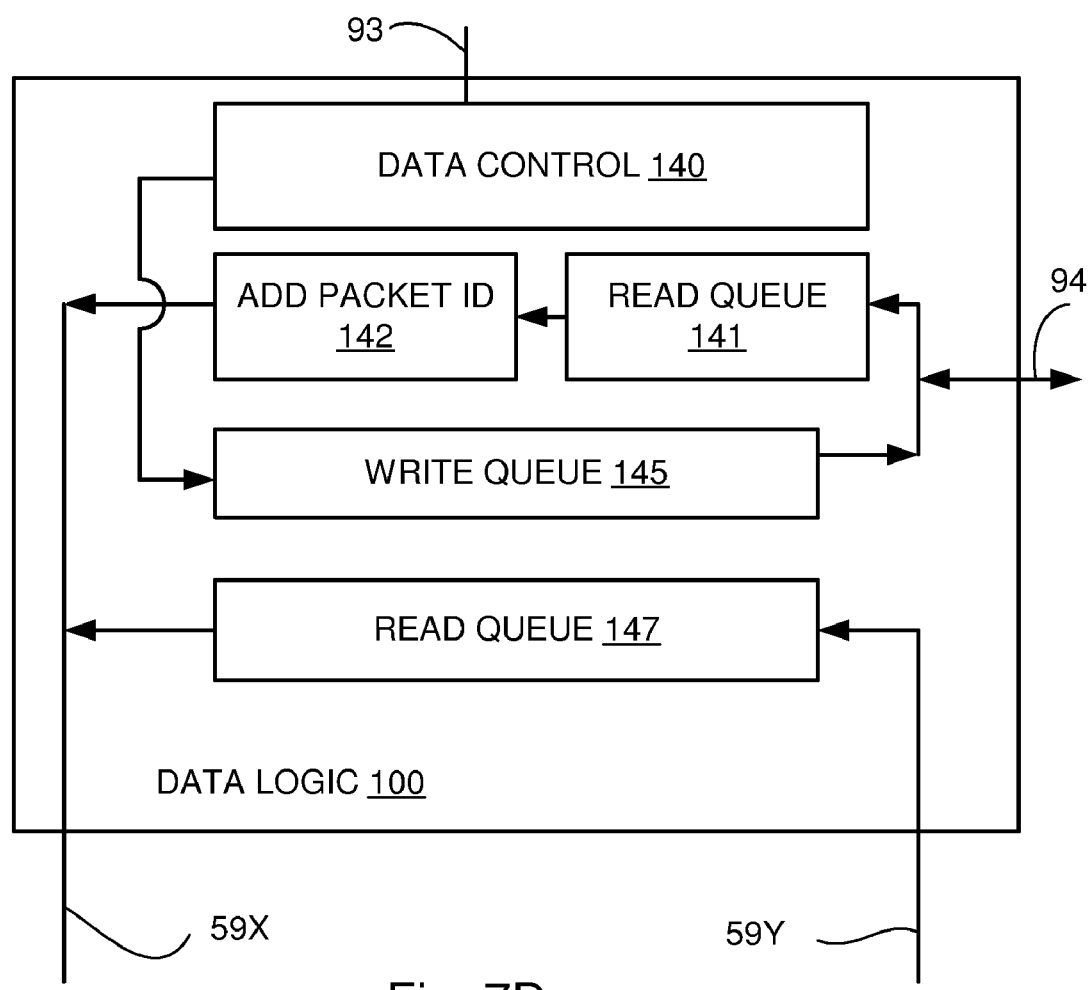
FIG. 7D is a block diagram of an alternate embodiment of a data logic block in a memory chip.

FIG. 7D shows a data logic 100 suitable for embodiments in which data to be written into an array 55 of a memory chip 54 is sent as part of an address/command word 120 as described earlier, that is, write data 126, shown in FIG. 5B. Data control 140 in FIG. 7D is similar to data control 140 in FIG. 7A, but receives write data 126 on signals 93 (FIG. 5B) to be written into array 55 (see FIG. 4) on signals 94. Data control 140 passes write data 126 and packet ID 123 to write queue 145. A particular write data 126 is written into array 55 when write queue 145 is able to do so (that is, when array 55 is not being otherwise accessed and when whatever priority arbitration mechanism in a particular implementation selects the particular write data 126 from write queue 145.

Read queue 141, add packet ID 142, and read queue 147 are as explained in reference to FIG. 7A.

Programmable apportionment of data bus 59 was introduced earlier, and will be described in detail now with reference to FIGS. 7E and 7F. As stated earlier, many scientific applications require approximately the same bandwidth for writes as for reads. In such applications, data bus 59X should have approximately the same number of signal conductors carrying write data words 130 outward for writes to a memory chip 59 as signal conductors carrying read data words 130 inward for reads from a memory chip 59. Other applications, such as commercial applications, need considerably more bandwidth for reads than for writes.

Figure 7E:
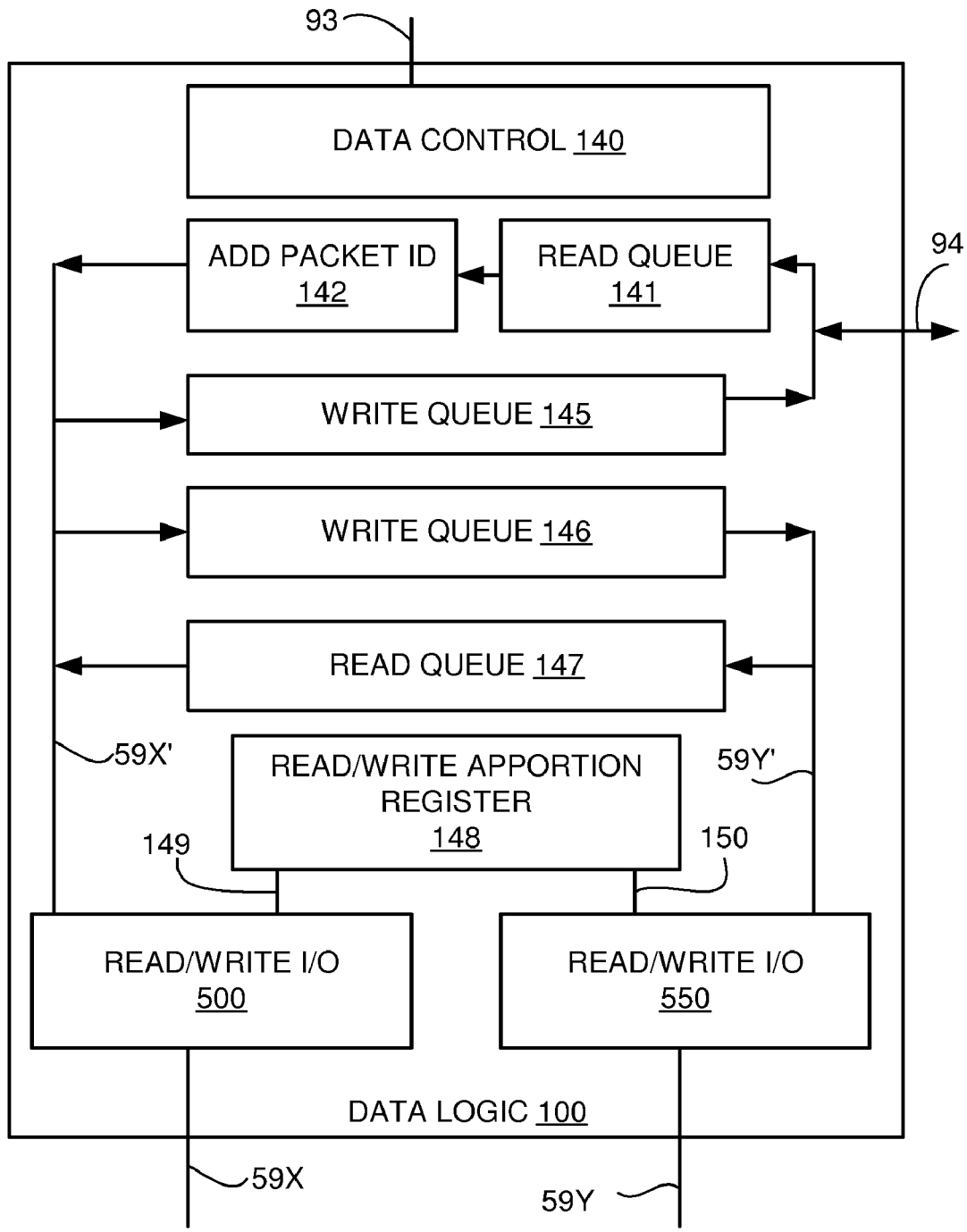
FIG. 7E is a block diagram of an alternative data logic block suitable for programmable apportionment of a data bus.

FIG. 7E shows a block diagram of a data logic 100 that provides a programmable apportionment of data bus 59 between an outgoing portion and an incoming portion. A read/write apportion register 148 contains a desired apportionment. The desired apportionment can be scanned into read/write apportion register 148 at bring up of computer system 250. Alternatively, an application running on processor 200 can request memory controller 52 to write read/write apportion registers 148 in each daisy chain of memory chips 47 connected to the memory controller 52. Memory controller 52 and memory chips 54 must, at any given time, be in agreement as to how data bus 59 is apportioned between an outgoing portion and an ingoing portion. In an alternative embodiment, pins on each memory chip, and memory controller 52 are simply connected to appropriate voltages to provide a fixed apportionment. In such an alternative embodiment, the logical value supplied by the connection of pins to appropriate voltage values performs the same role as read/write apportion register 148.

Alternatively, apportionment of data bus 59 is done by transmission of a desired apportionment from processor 200 to memory controller 52. Memory controller 52 subsequently transmits the desired apportionment to memory chips 54 (e.g., in an address/command word 120 having a suitable command 122 and an apportionment value in a portion of address 124).

In another alternative embodiment, memory controller 52 has one or more I/O pins connected to sources of logical values that, when powered, program the apportionment at memory controller 52. Memory controller 52 must forward the apportionment to memory chips 54, such as the memory chips 54 in a daisy chain of memory chips 47. Memory controller 52 creates an address/command word 120 having a command value in command 122 that memory chips 54 are configured to recognize an apportion command. Memory controller 52 fills in a value in a portion of address 124 that memory chips 54 use to make the apportionment at the memory chip 54.

A read/write I/O block 500 contains circuits that are receivers only, drivers only, or common I/Os. A common I/O is a circuit that can either be a driver or a receiver based on a value of a control signal. Read/write I/O 500 is coupled to read/write apportion register 148 via signals 149. Read/write I/O 500 provides for receiving write data words 130 on data bus 59X, where, as before, data bus 59X is on a proximal side, logically, to memory controller 52. Read/write I/O 500 also provides for driving read signals back in the direction of memory controller 52 on data bus 59X. A read/write I/O 550 block provides a function similar to read/write I/O block 500, but for data bus 59Y, where, as before, data bus 59Y is on a distal side, logically, from memory controller 52. Read/write I/O 550 is controlled by read/write apportion register 148 by signals 150. Other referenced numbered blocks in FIG. 7E are as described for like numbered blocks described earlier.

Figure 7F:
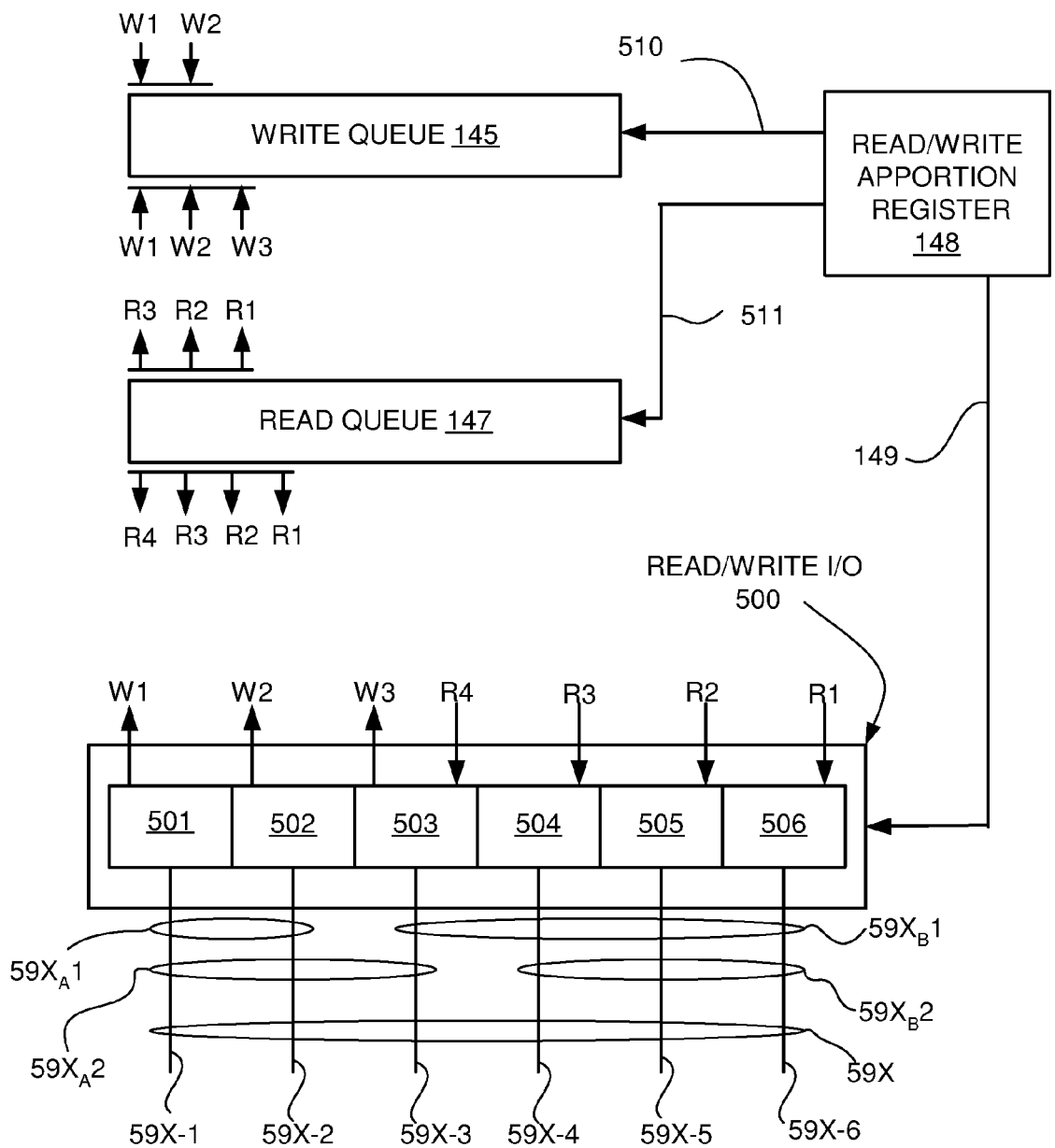
FIG. 7F is a block diagram showing details of how programmable apportionment of a data bus is implemented.

FIG. 7F shows in more detail how read/write apportion register 148 controls apportionment of data bus 59.

Data bus 59X is shown, for exemplary purposes, to have six signal conductors (59X-1 to 59X-6). I/O circuits 501-506 drive and/or receive signal conductors 59X-1 to 59X-6 as shown in FIG. 7F and described herein.

Data bus 59X, in a first apportionment, has two signal conductors (59X-1 and 59X-2) apportioned to write data, circled and referenced as $50X_A1$. I/O circuits 501 and 502 are controlled by signals 149 to be receivers. In the example, I/O circuits 501 and 502 are never used as drivers, and could alternatively be designed as receivers only. In the first apportionment, four signal conductors (59X-3, 59X-4, 59X-5, 59X-6) are apportioned to read data, with these four signal conductors circled and referenced $59X_B1$. Read/write apportion register 148 controls signals 149 to control I/O circuits 503, 504, 505, and 506 to be drivers which will drive data from reads on signals 59X-3, 59X-4, 59X-5, and 59X-6 back in the direction of memory controller 52. In the first apportionment, data bus 59 uses twice as many signal conductors to drive read data back towards memory controller 52 as are used to drive write data outwards to a memory chip 54.

In the first apportionment, data received by I/O circuits 501 and 502 are sent on signals W1 and W2 to write queue 145 and are written into a data word in write queue 145 under control of read/write apportion register 148 via signals 510. Signals 510 instruct write queue 145 to accept W1 and W2 and then shift the data word by two bit positions in order to receive two new signals on W1 and W2. This process is repeated until a data word 130 is filled. A similar process is used to move data from signals 59X-1 and 59X-2 into write queue 146 when a write data word 130 is not directed to the particular memory chip 54 and therefore needs to be re-driven to another memory chip 54.

In some embodiments, a write data word 130 is shifted into a temporary buffer (not shown) and the data word 130 is transferred to write queue 145 or write queue 146 (FIG. 7A) once it is determined if the write data word 130 is to be written to the present memory chip 54 or needs to be re-driven.

In the first apportionment, four bits at a time from read queue 147 (R1-R4) are sent to I/O circuits 503-506, respectively. Read/write apportion register 148 controls I/O circuits 503-506 to drive signal conductors 59X-3, 59X-4, 59X-5, and 59X-6 with the values on R1-R4. Read/write apportion register, via signals 511, controls read queue 147 to shift by four bits each cycle in order to present the next four bits of a data word 130 stored in read queue 147.

In a second apportionment, data bus 59 is apportioned equally between outgoing data and incoming data. That is, signals 59X-1, 59X-2, and 59X-3 are used for write data, as shown grouped as $59X_A2$. Incoming read data is transmitted back in the direction of memory controller 52 on signal conductors 59X-4, 59X-5, and 59X-6, as shown grouped as $59X_B2$. Read/write apportion register 148 controls I/O circuits 501, 502, 503 to be receivers; I/O circuits 504, 505, and 506 to be drivers. In the example, I/O circuits 504, 505, and 506 are always used as drivers, and a receiver portion of I/O circuits 504, 505, and 506 is not required. Test requirements, in some applications, may require that all I/O circuits (501-506) be common I/O circuits, whether functionally required or not.

In the second apportionment, I/O circuits 501, 502, and 503 send signals W1, W2 and W3 to write queue 145. Read/write apportion register 148, via signals 510, causes the selected data word register in write queue 145 to shift three bits at a time. Similarly, read/write apportion register 148, via signals 511, causes the selected register in read queue 147 to shift three bits at a time, in order to send three new bits of data word 130 via R1, R2, R3 to I/O circuits 504, 505, and 506 to be driven on signal conductors 59X-4, 59X-5, and 59X-6. Data words from add packet ID 142 are treated in a similar manner to data words from read queue 147.

Circuitry and control of read/write I/O 550 is similar to circuitry and control of read/write I/O 500. Read/write apportion register 148, via signals 150 controls which signals on data bus 59Y are used for write data words 130 and which signals on data bus 59Y are used for read data words 130. Memory controller 52 also contains similar circuitry and control to apportion data bus 59 connected to memory controller 52 between an outgoing portion used for write data words 130 and an incoming portion used for read data words 130.

Programmable apportionment of a data bus 59 between a first portion dedicated to write data and a second portion dedicated to read data can also be expressed as a method embodiment.

Figure 19:
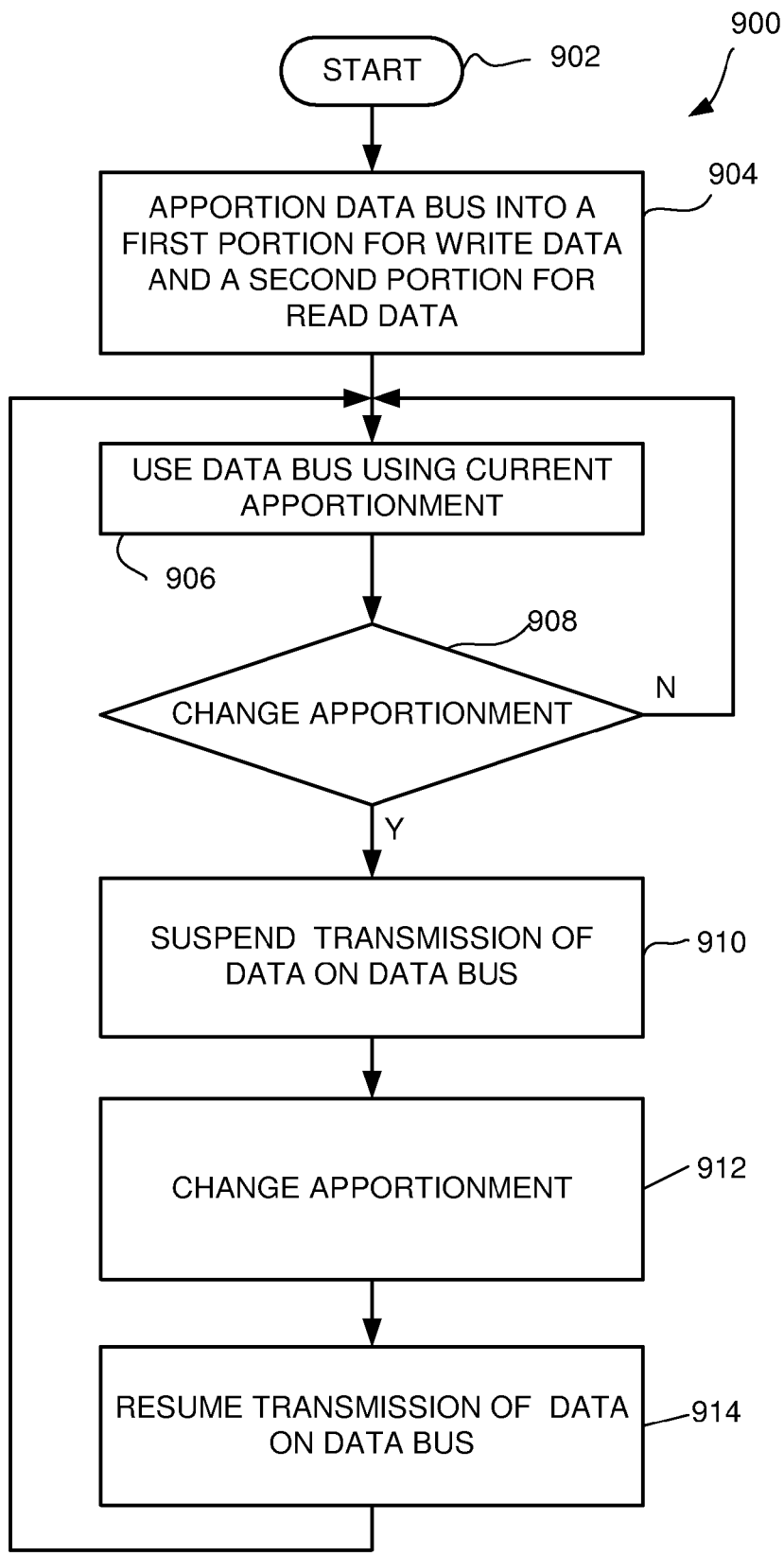
FIG. 19 is a flow chart of a method that provides programmable apportionment of a data bus.

Referring now to FIG. 19, method 900 is shown. Method 900 begins at step 902. In step 904, data bus 59 is apportioned into a first portion dedicated to write data and a second portion dedicated to read data. In step 906 the data bus is used according to the current apportionment; that is, write data is transmitted to a memory chip 54 using the first portion of the data bus, and read data is transmitted from a memory chip 54 to memory controller 52 using the second portion of the data bus. In an embodiment having a fixed programmable apportionment (e.g., programmed by connection of I/O pins to appropriate sources of logical values) the method ends and the apportionment is not changed.

In an embodiment where apportionment is dynamically programmable, such as upon a request for a change of apportionment by processor 200, control passes to step 908. If no change in apportionment is requested, control passes back to step 906. If a change in apportionment is requested, control passes to step 910, which suspends transmission data words 130. In an embodiment, suspending transmission of data words 130 includes sending one or more address command words 120 having a command that alerts memory chips 54 that a reapportionment of data bus 59 is pending and to stop sending read data words 130. Memory controller 52 allows sufficient time for any already transmitted write data word 130 to be received by the proper memory chip 54 and any already transmitted read data word to be received by memory controller 52, then sends another address/command word 120 having information as to the new apportionment.

In step 912, data bus 59 is re-apportioned between the first portion used for write data and the second portion used for read data. Upon completion of the re-apportionment, control passes to step 914, which resumes transmission data words 130 on data bus 59.

Figures 8, 9A:
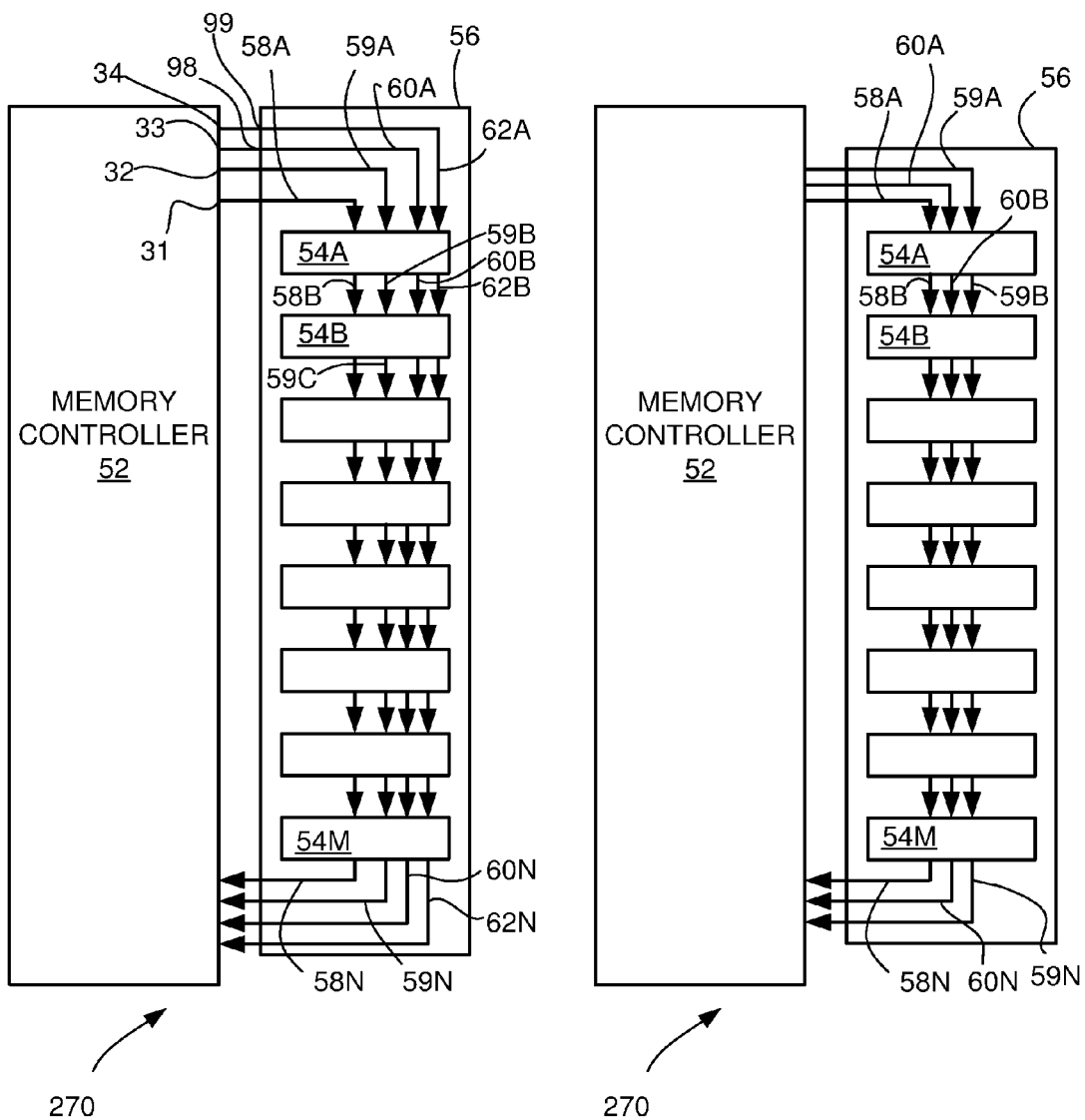
FIG. 8 is a block diagram illustrating an alternative interconnection embodiment of the invention.
FIG. 9A is a block diagram similar to that shown in FIG. 8, but using self timed memory chips.

Embodiments of the invention implement address/command bus 58 and data bus 59 interconnection of a daisy chain of memory chips 47 as shown in FIG. 8. FIG. 8 shows memory system 270 having memory controller 52 driving address/command bus 58A and unidirectional data bus 59A. Data bus 59A does not have two portions as depicted in FIG. 4A (59X$_A$, 59X$_B$), but, rather, is a single, unidirectional data bus. As shown in FIG. 8, a number of memory chips 54 (memory chips 54A-54M) are attached on carrier 56.

Data words 130 (data words shown in FIGS. 7B and 7C) are driven onto data bus 59A at data bus port 32 (one shown referenced in FIG. 8) by memory controller 52 for writing into a memory chip 54. Data words 130 having data 131 read from a memory chip 54 are received by memory controller 52 on data bus 59N. For example, memory controller 52 needs to write data into memory chip 54A and read data from memory chip 54B. An address/command word 120 is transmitted at address/command bus port 31 (one shown referenced in FIG. 8) on address/command bus 58A and is recognized by memory chip 54A as a write into its array 55 for data having a packet ID value matching the value in packet ID 123 of the address/command word 120. As described earlier, data 131 from a write data word 130 having a packet ID 132 matching the packet ID 123 of address/command word 120 is written into the array 55 of memory chip 54A. The address/command word 120 for the write into memory chip 54A, in an embodiment, is not forwarded, as the succeeding memory chips 54 in the daisy chain do not require it. In a second embodiment, the address/command word 120 for the write into memory chip 54A is passed to subsequent memory chips in the daisy chain on address/command busses 58 (e.g., 58B) and the address/command word 120 is returned on address/command bus 58N to memory controller 52, confirming to memory controller 52 that the address/command word was successfully transmitted.

Continuing the example of the embodiment shown in FIG. 8, memory controller 52 subsequently sends an address/command word 120 requesting a read from memory chip 54B. Memory chip 54B recognizes and receives the request and, when the requested data has been read from array 55 on memory chip 54B, and, when the data logic 100 of chip 54B determines that data can be transmitted on data bus 59C, the appropriate read data word 130 is transmitted on data bus 59C and continues through the daisy chain and is received on data bus 59N by memory controller 52. Bus clock 60A and timing signals 62A are likewise chained through daisy chain of memory chips 47A-54M, and, at the end of the daisy chain of memory chips 47A-54M are shown being returned to memory controller 52 as bus clock 60N and timing signals 62N. Bus clocks 60 are brought onto or driven from memory 52 at bus clock port 33 (one shown referenced in FIG. 8). Timing signals 62 are driven from or received by memory controller 52 at timing signals port 34 (one shown referenced in FIG. 8).

Bus clocks 60 are carried onto or off of a carrier 56 via bus clock off-carrier connectors 98, one of which is referenced in FIG. 8. Timing signals 62 are carried onto or off of a carrier 56 via timing signals off-carrier connectors 99, one of which is referenced in FIG. 8.

Each memory chip 54 in a daisy chain of memory chips 47 can be processing requests for reads and/or writes in parallel. For example, memory controller 52 may issue a read request (using an appropriate address/command word 120 transmitted on address/command bus 58A) for memory chip 54A, with memory controller 52 sending subsequent additional read (or write) requests to other memory chips 54 in the daisy chain of memory chips 47 before memory chip 54A has fetched the requested data from array 55 in memory chip 54A. In addition, multiple read (or write) commands can be queued up in each particular memory chip 54 as explained in the discussion on address/command queue 81 in FIG. 6A, and the read and write queues described in FIG. 7A. Some memory chips 54 may comprise multiple banks of memory that can be accessed independently from each other. In such memory chips 54, multiple reads and/or writes can be in progress at the same time on the same memory chip 54.

Such parallel handling of requests can occur when transmission of address/command words 120 and transmission of data words 130 are fast relative to read and write times in arrays 55 on memory chips 54. For example, if reads and writes to arrays 55 take eight times longer than a transmission of an address/command word 120 or a data word 130, it is possible to have each memory chip 54 in an eight memory chip 54 daisy chain processing reads and writes at once. Currently, read and write times of DRAM memory chips is about 40 ns (nanoseconds). A twenty bit address/command word 120 transmitted at 10 Gb/s takes two nanoseconds to transmit, assuming a single bit wide address/command bus 58.

FIG. 9A shows a further embodiment of the invention. FIG. 9A shows memory system 270 having memory controller 52 coupled to memory chips 54 on carrier 56, as was shown in FIG. 8. The embodiment shown in FIG. 9A does not need timing signals 62 (see FIG. 8) since arrays 55 on memory chips 54 are self timed in the embodiment depicted in FIG. 9A. Bus clock 60 controls the speed at which data is received and transmitted on address/command busses 58 and data busses 59. In prior figures and descriptions, a conventional clocking scheme was assumed (e.g., using timing signals 62 and timing block 63 as shown in FIG. 4). It will be understood that, where self timed memory chips are used, timing signals 62 are not required to be transmitted by memory controller 52 and chained through a daisy chain of memory chips 47. In some prior figures, for simplicity, bus clock 60 was not shown (e.g., FIGS. 3A, 3B, and 6B).

Figure 9B:
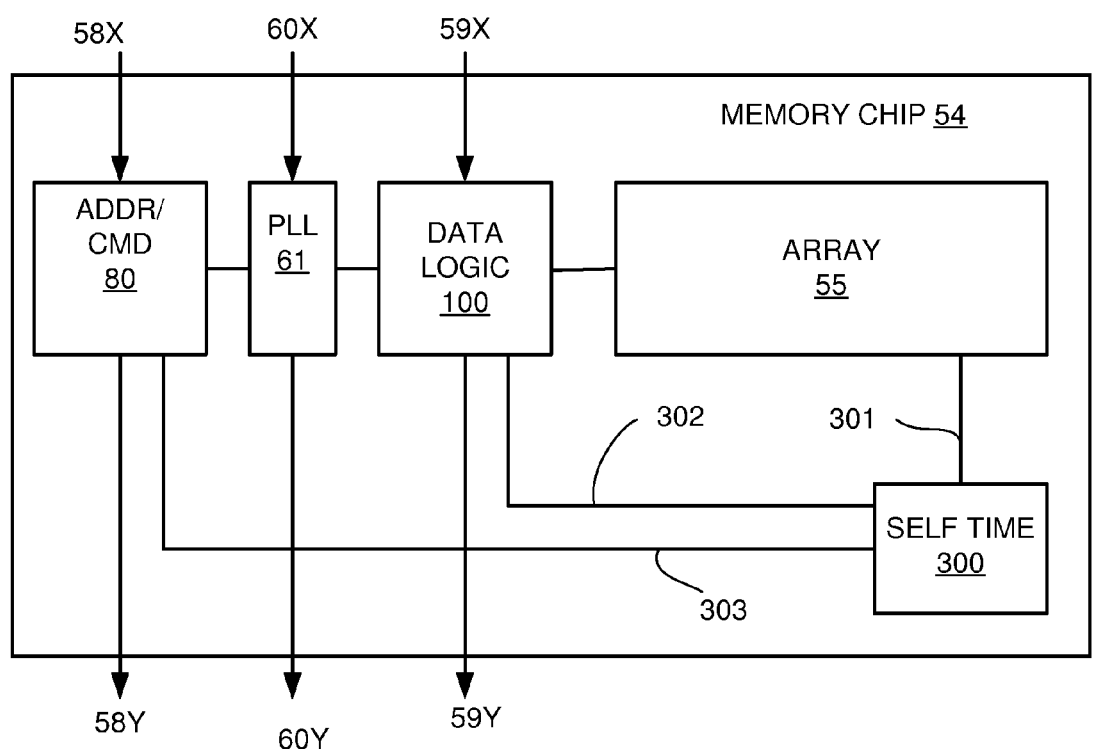
FIG. 9B is a 12A block diagram of the memory chip of FIG. 9A, showing further details of how an array on the memory chip is self timed.

FIG. 9B is a block diagram of an exemplary memory chip 54 that has a self timed array 55. As explained above, bus clock 60 provides for a bus frequency at which data is received and transmitted on address/command busses 58 and data busses 59. Clock bus 60 may provide a clock frequency, e.g., 5 GHz (gigahertz) at which data is sent or received on address/command busses 58 and data busses 59. Often, in high speed links, a 5 GHz bus clock, using double data rate techniques, would result in a 10 gigabit per second data transfer on each signal conductor in a bus. Alternatively as shown in FIG. 9B a lower frequency clock can be sent on bus clock 60 and transformed on each memory chip 54 via a Phase Lock Loop (PLL) 61 to the appropriate frequency of address/command busses 58 and data busses 59. A self time block 300 is used to read data from and write data to array 55. Timing signals 62 and timing block 63 are not implemented in a self timed embodiment of memory chip 54.

Array 55 comprises bit lines (not shown) that need to be precharged by bit line precharge circuits (not shown) and discharged by memory cells (not shown). Precharge and discharge times tend to differ between a first memory chip 54 and a second memory chip 54 due to process variations when the first memory chip 54 and the second memory chip 54 were produced. Furthermore, array 55 access times are also dependent on temperature of array and voltage applied to array 55.

In the daisy chain of memory chips 47 shown in FIG. 8, all memory chips are clocked at the same frequency, that is, by timing signals 62. That frequency typically accommodates a slowest memory chip 54 at designer specified worst case voltage and temperature conditions.

The embodiment illustrated in FIGS. 9A and 9B show a particular memory chip 54 to have array 55 on that particular memory chip 54 to be read from or written to at a rate determined by actual access times which include actual precharge and discharge rates of the array 55 on the particular memory chip 54.

Self time block 300 is coupled to array 55, address/command 80 and data logic 100 on self time signals 301, 302, and 303. Self time block 300, as described in detail below, will cause arrays 55 that can be accessed faster to be accessed faster, and arrays 55 that are relatively slower in performance to be accessed more slowly.

For example, if a particular daisy chain of memory chips 47 has eight memory chips 54, and a first memory chip in the particular daisy chain of memory chips 47 takes 60 ns (nanoseconds) to access, while the remaining seven of the memory chips 54 in the particular daisy chain of memory chips 47 require only 30 ns to access, average access rates of the particular daisy chain of memory chips 47 that feature a self time block 300 (that is, are self-timed memory chips 54) are almost twice as fast as a daisy chain of memory chips 47 that are not self timed memory chips 54. In other words, seven of the eight memory chips 54 access in 30 ns; only one accesses at 60 ns.

Self time block 300 contains a ring oscillator for DRAM performance monitoring. U.S. Pat. No. 6,774,734 teaches a ring oscillator having a frequency determined by a dynamic memory performance.

Figure 10:
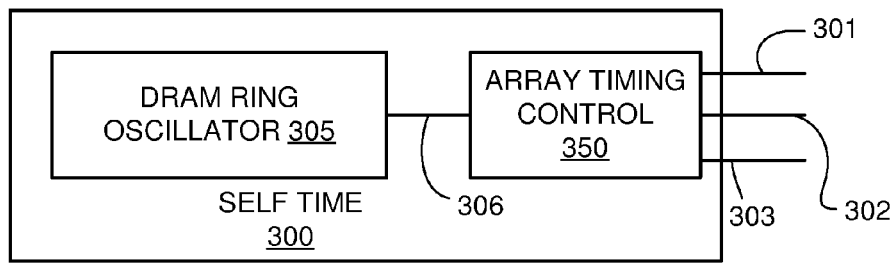
FIG. 10 is a block diagram illustrating components of a self time block shown in FIG. 9B.

FIG. 10 shows self time block 300 further comprising a DRAM ring oscillator 305. DRAM ring oscillator 305, in embodiments, is DRAM ring oscillator 700 seen in FIG. 7 of U.S. Pat. No. 6,774,734, or multiplexed DRAM ring oscillator 800 seen in FIG. 8 of U.S. Pat. No. 6,774,734. DRAM ring oscillator 305 is implemented to be of similar design to array 55 so that access times will track.

Signal 306 in FIG. 10 couples an output of DRAM ring oscillator 305 to Array timing control 350, which provides self time signals, 302, and 303 introduced in FIG. 9B.

Figure 11A:
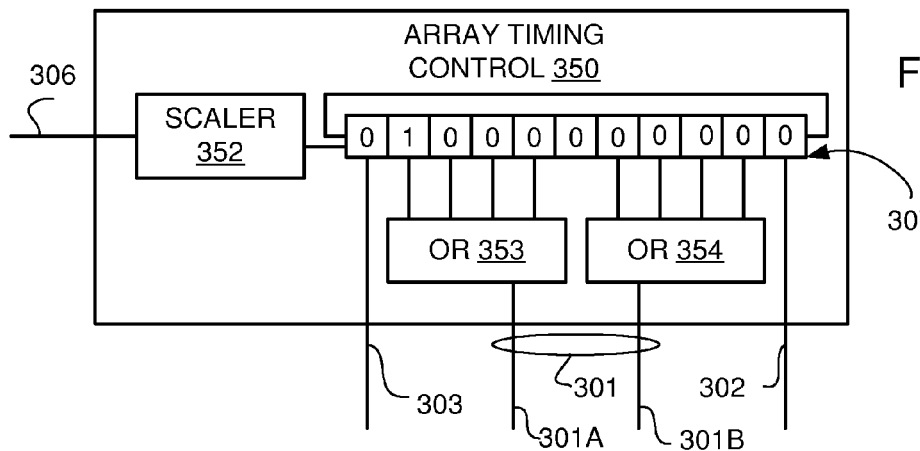
FIG. 11A is a block diagram illustrating a first embodiment of an array timing control block shown in FIG. 10.
Figure 11B:
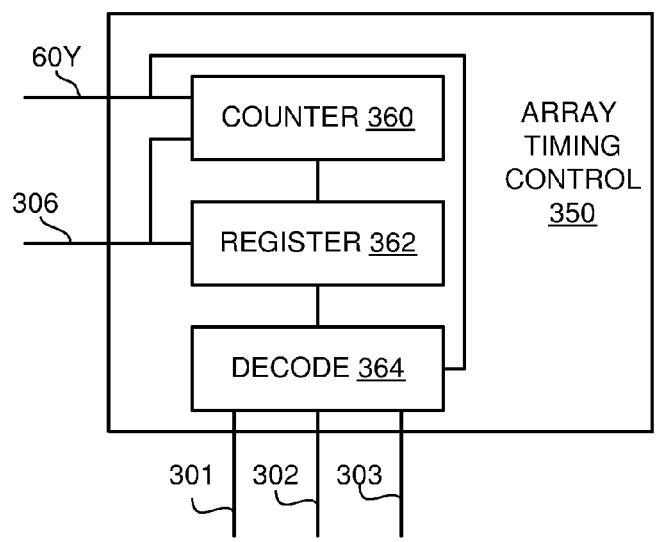
FIG. 11B is a block diagram illustrating a second embodiment of the array timing control block shown in FIG. 10.

Embodiments of Array timing control 350 are seen in more detail in FIGS. 11A and 11B. FIG. 11A shows signal 306 coupled to scaler 352. Scaler 352 adjusts the frequency of the signal from DRAM ring oscillator 305. Such adjustment is typically needed to provide appropriate granularity of control self time signals, 302, 303. For example, if DRAM ring oscillator 305 produces a frequency similar to a maximum frequency of access of array 55, scaler 352 will need to produce a higher frequency output in order to provide appropriate sub timings needed in typical designs of array 55.

A PLL embodiment of scaler 352 provides such a higher frequency. FIG. 11A shows scaler 352 providing a clock to register 307. Register 307 contains a single "1" with remaining bits "0". Register 307 wraps a final bit position to a first bit position, so that the "1" will constantly circulate at a frequency determined by DRAM ring oscillator 305 (as scaled by scaler 352). Address/command block 80 and data logic 100 are in communication with register 307 and can enable or disable shifting. For example, in absence of a request, the "1" will be held in a first bit position of register 307, when a request is started, address/command block 80 and/or data logic 100 enable shifting of register 307, and the "1" will then advance through register 307.

The "1" will remain in each bit position of register 307 for a time proportional to the frequency of DRAM ring oscillator 305. Signal 303, taken from a first bit position in register 307, latches an address (from a currently selected address/command word 120) into a word select circuit (not shown) in array 55 (FIG. 9B). A self time signal 301A in self time signal 301 activates a bit line precharge (not shown) in array 55 (FIG. 9B). A second self time signal 301B in self time signal 301 activates a word line activate which causes selected bit lines (not shown) to discharge in array 55 (FIG. 9B). OR 353 produces self time signal 301 A, which remains "1" when a "1" is in a second, third, fourth, or fifth bit position in register 307. Similarly, OR 354 produces self time signal 301B, which remains "1" when a "1" is in a seventh, eighth, ninth, or tenth position of register 307. An eleventh bit in register 307 is used for self time signal 302 which latches data read from array 55 into data logic 100. It will be understood that self time signals 301, 302, and 303 are exemplary only to illustrate how array timings on a memory chip can be made responsive to a ring oscillator, a frequency of the ring oscillator dynamically dependent on array timings. Actual number of self time signals required and required timings of such signals depends on details of a particular design of array 55.

A second embodiment of Array timing control 350 is shown in FIG. 11B. In this embodiment, timings of self time signals 301, 302, and 303 are again dependent on a frequency of DRAM ring oscillator 305. The frequency of DRAM ring oscillator 305, as above, tracks a rate at which array 55 can be accessed.

In the embodiment of FIG. 11B, it is assumed that the bus clock frequency is significantly higher than the frequency of DRAM ring oscillator 305, the difference in frequencies being sufficient to provide appropriate granularity of control of self time signals 301, 302, and 303. When signal 306 (output of DRAM ring oscillator 305) is "high" (half the period of the signal on signal 306), bus clock 60Y increments counter 360. When signal 306 falls, a current value of counter 360 is captured in register 362, and counter 360 is reset. The value captured in register 362 is relatively larger when DRAM ring oscillator 305 is "slow", and relatively smaller when DRAM ring oscillator 305 is "fast". DRAM ring oscillator 305 is, as stated above, designed to track performance of array 55. A decode 364 uses bus clock 60Y and the value captured in register 362 to provide timings of self time signals 301, 302, and 303. For example, if register 362 has a relatively large value, array 55 is relatively slow, and a relatively long precharge time and discharge time is required to access (read or write) to array 55. Alternatively, if register 362 contains a relatively low value, precharge and discharge of array 55 is relatively fast, and array 55 can be accessed at a faster rate.

Different bus clock 60Y frequencies may be used in different memory systems. Decode 364 is advantageously programmable (e.g., by conventional scan-in of bus clock frequency information) to accommodate different bus clock frequencies.

Timings of each chip 54's accesses to array 55 is asynchronous with bus clock 60. Conventional synchronization techniques are used in address/command 80 and data logic 100 (FIG. 9B) when providing for data transmission on address/command bus 58 and/or data bus 59.

In some embodiments of the invention, memory controller 52 transmits address/command words 120 timed such that collisions do not occur on data bus 59. In a daisy chain of self timed memory chips, memory controller 52 is configured to periodically request, using an appropriate command 122 in an address/command word 120, to a memory chip 54 to transmit a data word 130 having an update on access timings of the array on memory chip 54. In an embodiment, memory chip 54 is not allowed to change access times of array 55 until authorized to do so by another address/command word 120. In such an embodiment, a "new" access time value is held in a temporary storage (not shown), the "new" access time being applied to array access timings upon approval by memory controller 52.

Data bus 59 typically requires more bandwidth than address/command bus 58. For example, address/command bus 58, in a particular implementation, carries address/command words 120 which further comprise (see FIG. 5) a four-bit chip ID 121, a one-bit command 122, an eight-bit packet ID 123, and a sixteen-bit address 124. Each command/address word 120 is associated with a data word 130 (see FIG. 7B, 7C) which, for example, comprises a four-bit chip ID 133, an eight-bit packet ID 132, and a 64-bit data 131. In the example, command/address word 120 contains 29 bits; data word 130 contains 76 bits. In an embodiment, data bus 59 is simply made proportionally wider than a corresponding address/command bus 58. In the example, data bus 130 is made 76/29 times the width of address/command bus 58. It will be understood that the bus width ratios of address/command bus 58 to data bus 130 need not be exactly the same as the required bandwidth. In the example, a ratio larger than 76/29 would tend to reduce memory latency as data busses 59 would be less congested.

Figure 12:
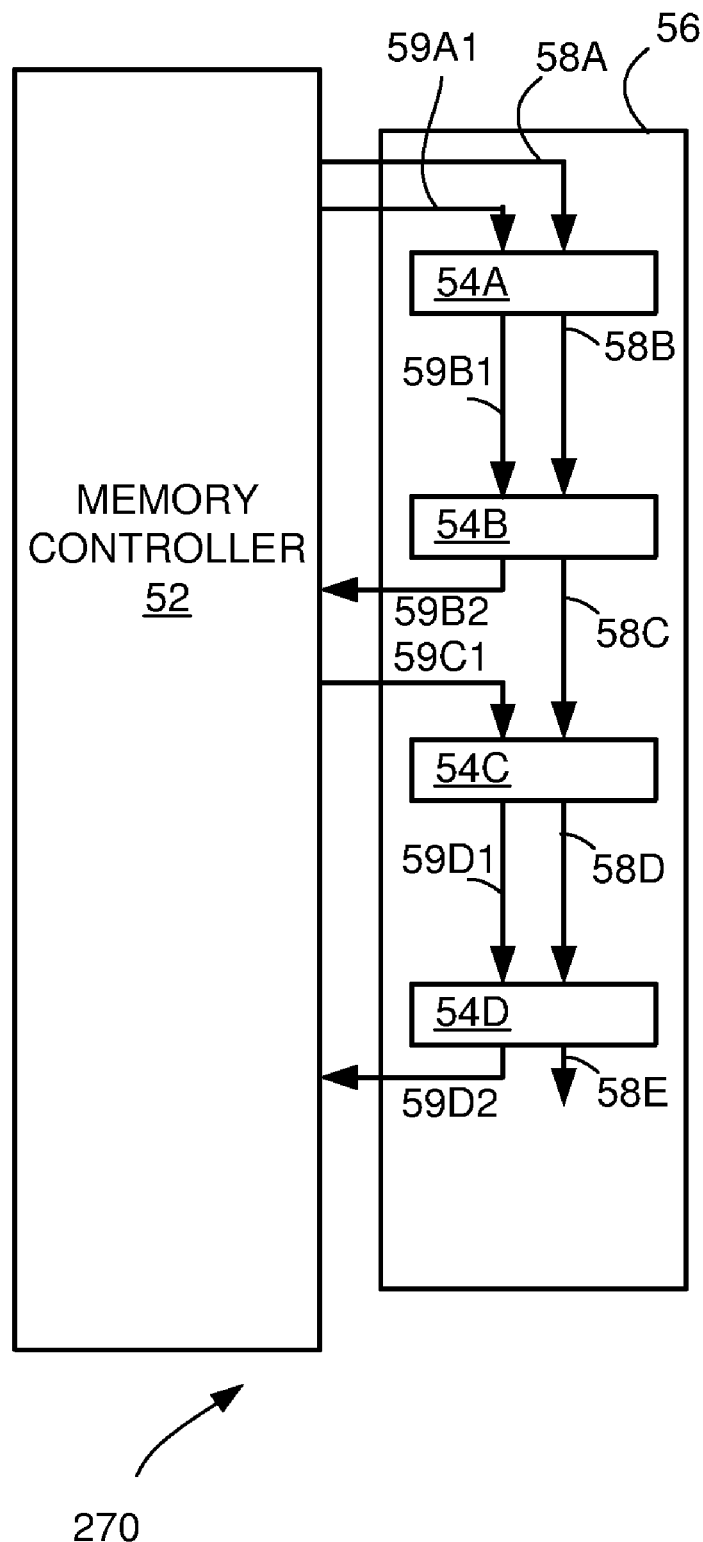
FIG. 12 is a block diagram showing alternate signal routings of a data bus chain routed through a daisy chain of memory chips.

An alternate method of balancing bandwidth requirements on address/command bus 58 with bandwidth requirements on data bus 59 is shown in FIG. 12. FIG. 12 shows an exemplary memory system 270 in which a daisy chain of memory chips 47 has an address/command bus 58 chain that chains through all the memory chips 54 in the daisy chain of memory chips 47, but has a plurality of data bus 59 chains, none of which interconnect the entire daisy chain of memory chips 47.

Memory system 270 shown in FIG. 12 is similar to memory system 270 shown in FIG. 8 or FIG. 9A in the sense that both have a chained bus clock (and timing signals 62 when memory chips 54 are not self timed) and that address/command bus 58 runs through a daisy chain of memory chips 47 on carrier 56; four memory chips 54 (54A, 54B, 54C, 54D) are shown. Address/command bus 58A is driven by memory controller 52; address/command bus 58B is driven by memory chip 54A; address/command bus 58C is driven by memory chip 54B; address/command bus 58D is driven by memory chip 54C; and address/command bus 58E is driven by memory chip 54D. Address/command bus 58E is shown "floating"; in another embodiment, it can be connected back to memory controller 52 in a similar manner as address/command bus 58N in FIG. 8. FIG. 12 shows a first data bus chain having data bus 59A1, 59B1, and 59B2. A second data bus chain has data bus 59C1, 59D1, and 59D2.

In an embodiment, each data bus chain couples a single memory chip 54 to memory controller 52 so that data words 130 do not flow through memory chips 54 that are not target chips for the packets as identified by the packet ID 132 (FIG. 7B, 7C) or chip ID 133.

Figure 13:
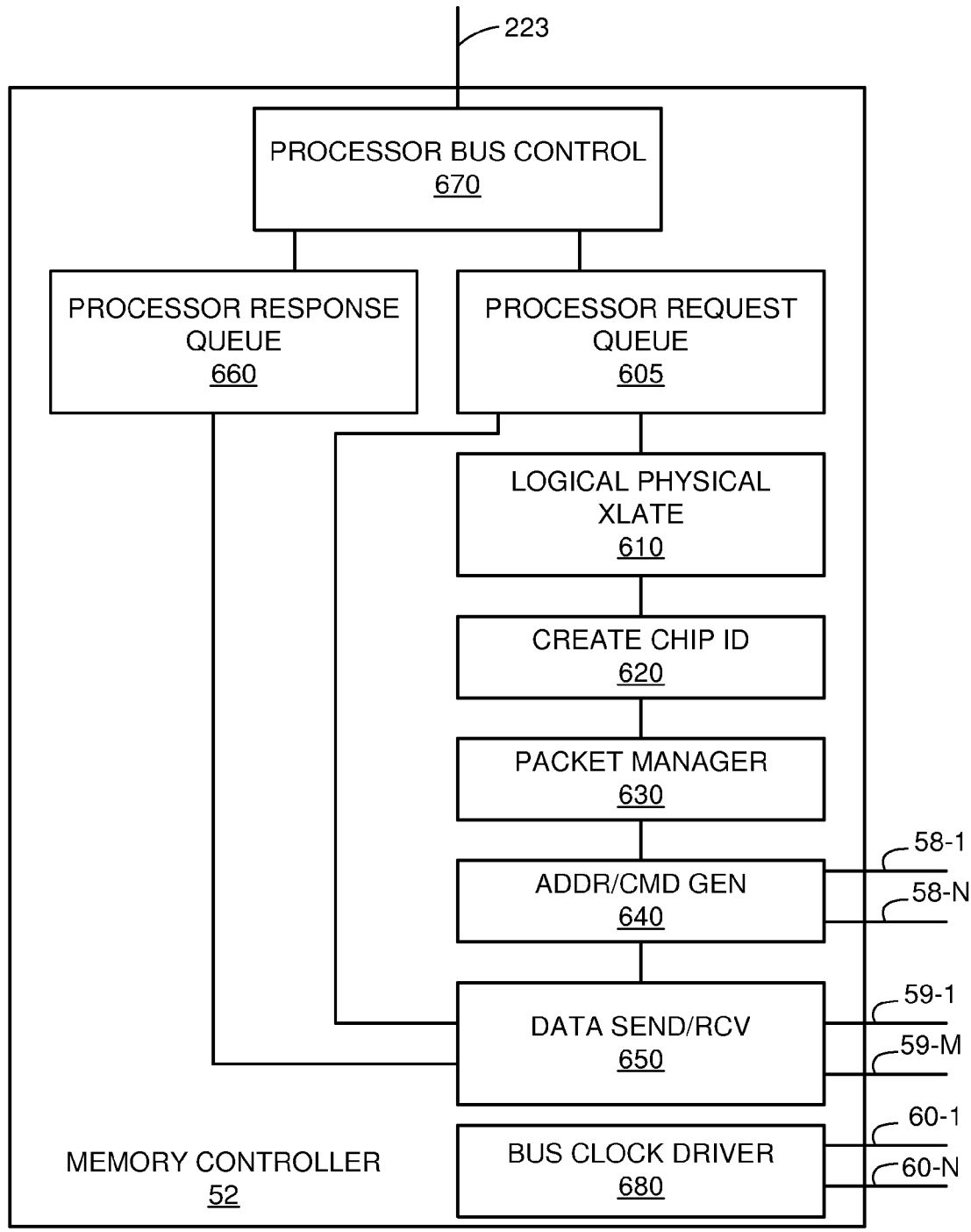
FIG. 13 is a block diagram of a memory controller according to embodiments of the invention.

FIG. 13 is a block diagram of memory controller 52. It is understood that there are many, often complicated, logic blocks implemented in various memory controllers. The present example memory controller 52 shown in FIG. 13 is suitable to explain embodiments of the invention.

Bus 223 (first shown in FIG. 2) couples memory controller 52 to processor 200. Processor bus 223 carries transmissions of requests for reads and writes to memory 210, along with data to be written into memory 210. Processor bus 223 also carries transmission of data that had been requested by processor 200 from memory controller 52 to processor 200. Typically, addresses transmitted on bus 223 are logical addresses. Processor bus control 670 receives the requests for reads and writes transmitted on bus 223 as well as data that is to be written to memory 210, and places such requests in processor request queue 605.

Logical/physical translate 610 translates the logical address received from the processor and, with information of the physical memory resources available (e.g., number of daisy chains of memory chips 47, number of carriers 56, amount of storage in each memory chip 54) translates the logical address into a physical address.

Create chip ID 620 uses the physical address and information as to the physical memory resources available to determine which daisy chain of memory chips 47 contains the physical address, and to create a chip ID (e.g., chip ID 121 shown in FIGS. 5A, 5B). For example, memory controller 52 has information regarding how many daisy chains of memory chips 47 are attached to memory controller 52, as well as amount of storage in each memory chip 54, and amount of data read or written to each memory chip 54 at one time. Memory controller 52 maintains a mapping (not shown) between each physical address (or, alternatively, address range) and which memory chip 54 holds data for that address or address range.

In an embodiment, the chip ID 121 is simply one or more bits from address 124. That is, the mapping mentioned above is a portion of address 124. In an embodiment in which chip ID is simply a portion of address 124, create chip ID 620 is not needed, as logical/physical translate 610 produces a physical address in such an embodiment that includes the portion of address 124 that identifies which chip an address/command word 120 is directed to.

Packet manager 630 assigns and keeps track of packets sent on each daisy chain of memory chips 47. For example, if there are 64 daisy chains of memory chips 47, and the memory controller supports sixteen outstanding requests on each daisy chain of memory chips 47, packet manager 630 must assign a unique packet ID 123 (such as zero to fifteen) for each outstanding address command word 120 on each daisy chain of memory chips 54. When a particular address/command word 120 is satisfied (i.e., the read or write is completed successfully) the corresponding packet ID 123 can be used again. Address/command generator 640 uses request information for a particular request in processor request queue 605, the address determined in logical physical translate 610, the chip ID and daisy chain of memory chips 47 determined in create chip ID 620, and the packet ID value determined in packet manager 630 to create an address/command word 120.

The address/command word 120 is transmitted on an address/command bus 58 according to the daisy chain of memory chips 47 determined in create chip ID 620. Address/command busses 58 are shown as 58-1 to 58-N. Packet manager 630 is not required in some embodiments as explained in reference to FIG. 18C, in which a sequencer 621 ensures in-order return of data from memory chips 54.

It will be understood that the same address/command word 120 can be sent to a plurality of daisy chains of memory chips 47, in order to quickly access a large amount of data in parallel. For example, if each memory chip 54 returns 64 bits in data word 130 (i.e., eight bytes), parallel access over eight daisy chains of memory chips 47 will return 64 bytes.

Data send/receive 650 sends data words for writes, using packet IDs assigned by packet manager 630, along with data from an associated processor write request in processor request queue 605. Data words 130 are sent to the proper daisy chain of memory chips 47 over data busses 59 (59-1 to 59-M shown). Data send/receive 650 also receives data coming back on data busses 59 and uses the packet ID 132 in the incoming read data word 130 to associate data 131 with the proper processor request. Data from read data word 130 is placed in processor response queue 660. Processor bus control 670 takes data 130 from processor response queue 660 and transmits data from read data word 130 back to processor 200.

In the examples given, memory chips 54, for exemplary purposes, have been described in terms of DRAM (dynamic random access memory) memory chips. However, it will be understood that memory chips 54, in embodiments, are SRAM (static random access memory) memory chips. SRAM chips typically also have circuitry that precharges bit lines and memory cells in such SRAM chips discharge either a true or a complementary bit line coupled to the memory cells. Self timed SRAM memory chips are also contemplated in embodiments of the invention. Such self timed SRAM memory chips, in embodiments, are daisy chained as shown as memory chips 54 in FIG. 9A, which uses bus clock 60 to provide address/command bus 58 and data bus 59 timings, while arrays 55 in memory chips 54 are accessed in a self-timed manner as explained earlier similar to when memory chips 54 are implemented in DRAM technology. Embodiments of the invention further contemplate daisy chains of memory chips 47 in which some of the memory chips 54 are SRAM memory chips and some of the memory chips 54 are DRAM memory chips.

Figure 14:
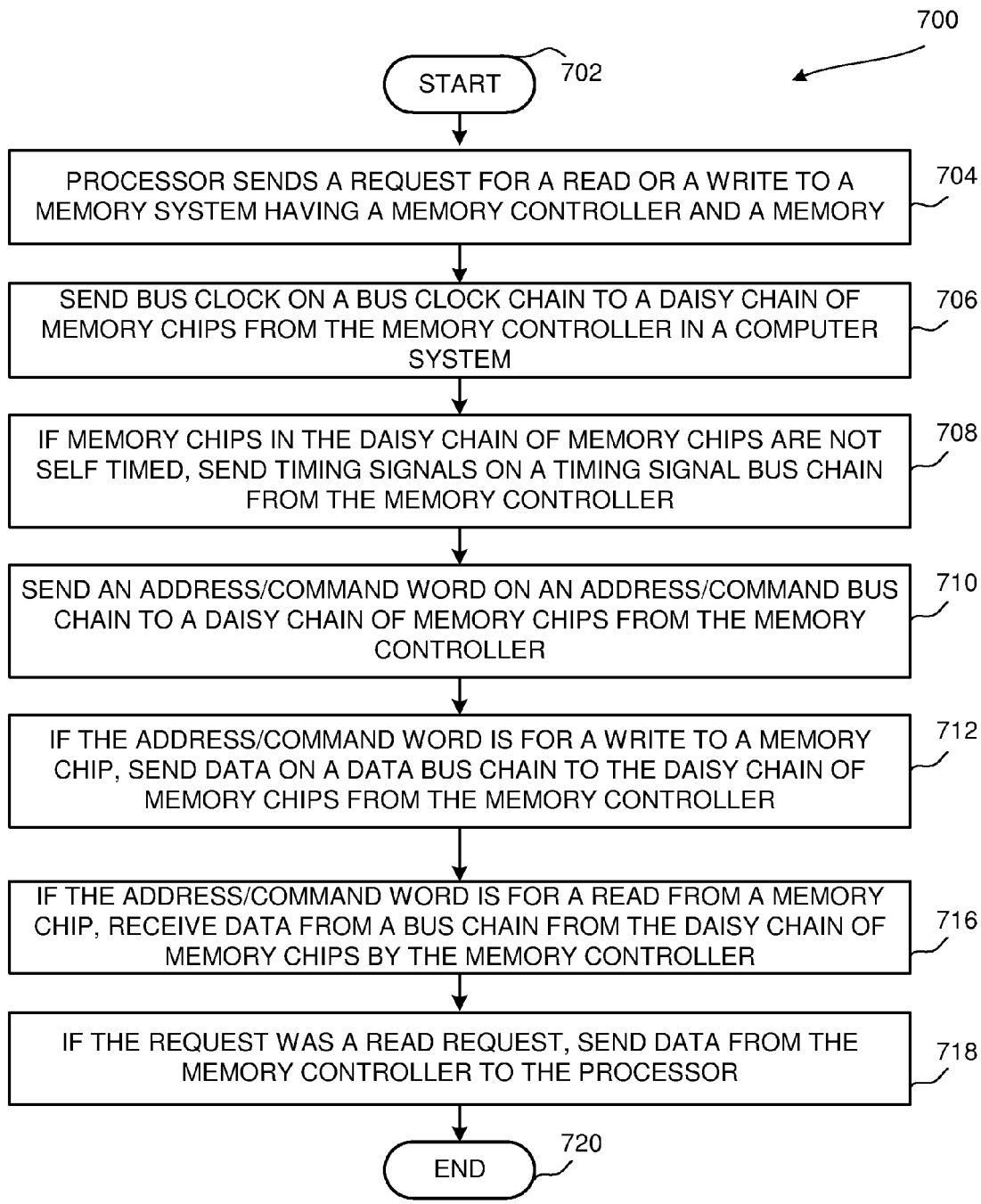
FIG. 14 is a flowchart of a method embodiment of the invention.

Embodiments of the invention are also expressed as methods. FIG. 14 is a high level flow chart of a method embodiment 700 of the invention. Method 700 begins at step 702. In step 704, a processor, such as processor 200 (FIG. 2) sends a request for a read or a write to a memory system such as memory system 270 in FIG. 2. The memory system further comprises a memory (memory 210) which further comprises one or more daisy chains of memory chips, the memory chips connected to the memory controller by a bus clock chain, an address/command bus chain, and a data bus chain.

In step 706, the memory controller sends a bus clock down a bus clock chain. The bus clock is received by a first memory chip in the daisy chain of memory chips, and is re-driven by the first memory chip to a second memory chip, and so on, through the daisy chain of memory chips. The bus clock is used to control how fast (i.e., at what frequency) address/command words and data words are transmitted on an address/command bus and on a data bus.

In step 708, if memory chips in the daisy chain of memory chips are not self timed, the memory controller transmits timing signals to a chain of timing signals. The timing signals are used by the memory chips to time accesses to arrays on the memory chips. FIG. 4 shows a timing block 63 that receives one link of the timing signal chain and drives a second link of the timing signal chain.

In step 710, the memory controller produces an address/command word, such as is shown in FIGS. 5A and 5B, and transmits the address/command word into a chain of address/command busses. FIG. 4 shows a memory chip 54 that receives a first link (58X) of the address/command bus and is configured to re-drive an address/command word on a second link of the address command bus (58Y).

In step 712, the memory controller produces a data word that is associated with the address command word when the address/command word is for a write. The data word is transmitted into a chain of data busses. FIG. 4 shows a memory chip 54 that receives a first link (59X) of the data bus and the memory chip is configured to re-transmit the data word onto a second link (59Y) in the chain of data busses.

in step 716, if the address/command word is for a read, the memory controller receives a read data word from the data bus that is associated with the request for data.

In step 718, the memory controller transmits the requested data to the processor. Step 720 ends the method.

Figure 15:
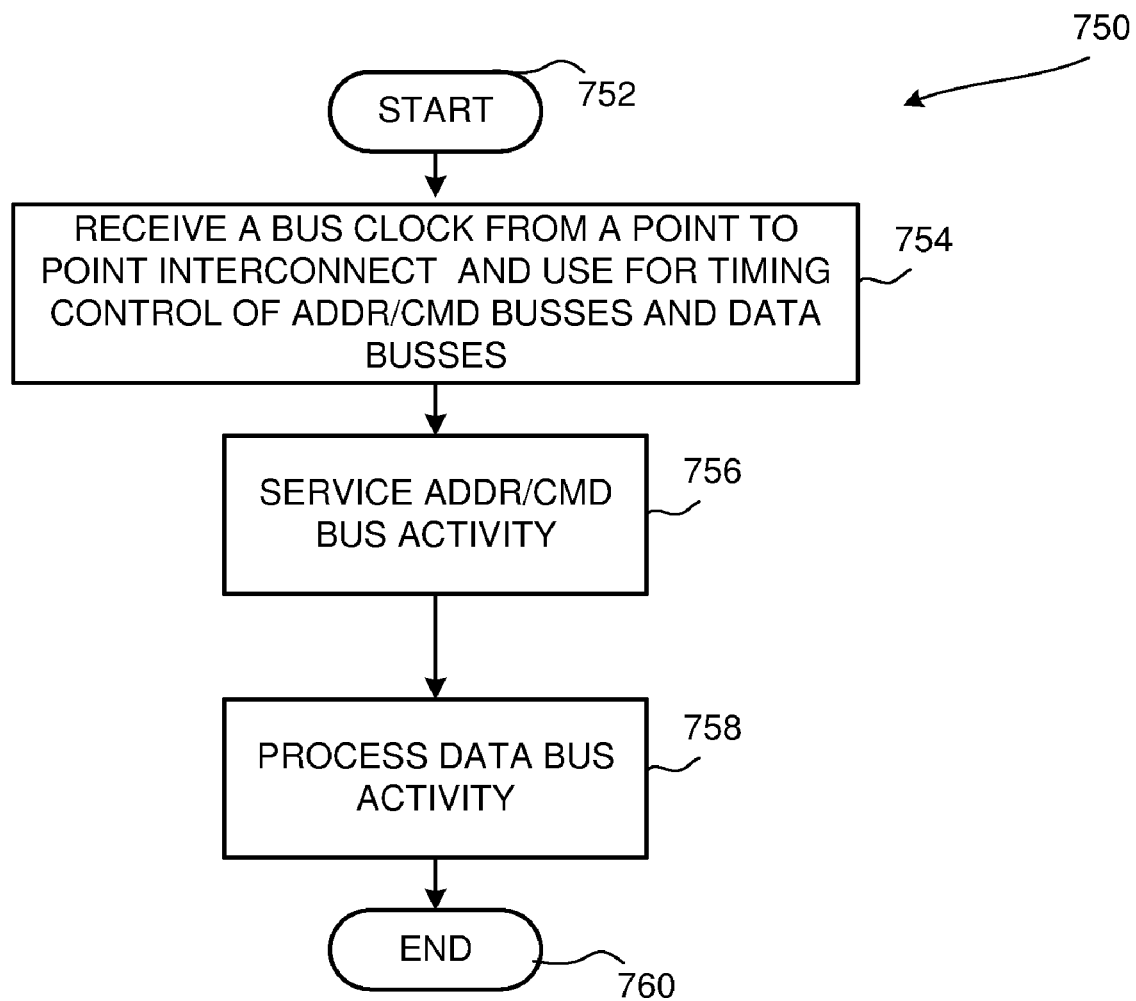
FIG. 15 is a flowchart of a method performed by a memory chip according to an embodiment of the invention.

FIG. 15 is a high level flow chart of method 750 used by a memory chip in a daisy chain of memory chips. Step 752 begins the process. In step 754, the memory chip receives a bus clock from a first link in a bus clock chain (see FIG. 4, bus clock 60X). If the memory chip is not the last memory chip in a chain of memory chips, the memory chip re-drives the bus clock onto a second link in the bus clock chain (see FIG. 4, bus clock 60Y). The bus clock is used to determine a frequency that address/command words are transmitted/received on an address/command bus and a frequency that data words are transmitted/received on a data bus.

In step 756, the memory chip services address/command bus activity. Step 756 is described in more detail in FIG. 16. In step 758, the memory chip processes data bus activity. As described supra in detail in the apparatus description, In brief, data words arriving on the memory controller side of the memory chip (FIG. 4, data bus $59X_A$) are examined for, in various embodiments, a chip ID in the data word that matches the memory chip ID of the present memory chip, or a packet ID in a data word that matches a packet ID in an address/command word. If a match occurs, data in the data word is stored in an array in the present memory chip. If not, the data word is re-transmitted to the next memory chip in the daisy chain of memory chips (FIG. 4, data bus $59Y_A$). If a data word is received on a distal side of the memory chip from the memory controller (FIG. 4, data bus $59Y_B$), the data word is re-transmitted by the memory chip onto a data bus link on a data bus link on a proximal side, relative to the memory controller, of the memory chip (FIG. 4, data bus $59X_B$). Step 760 ends method 750.

Figure 16:
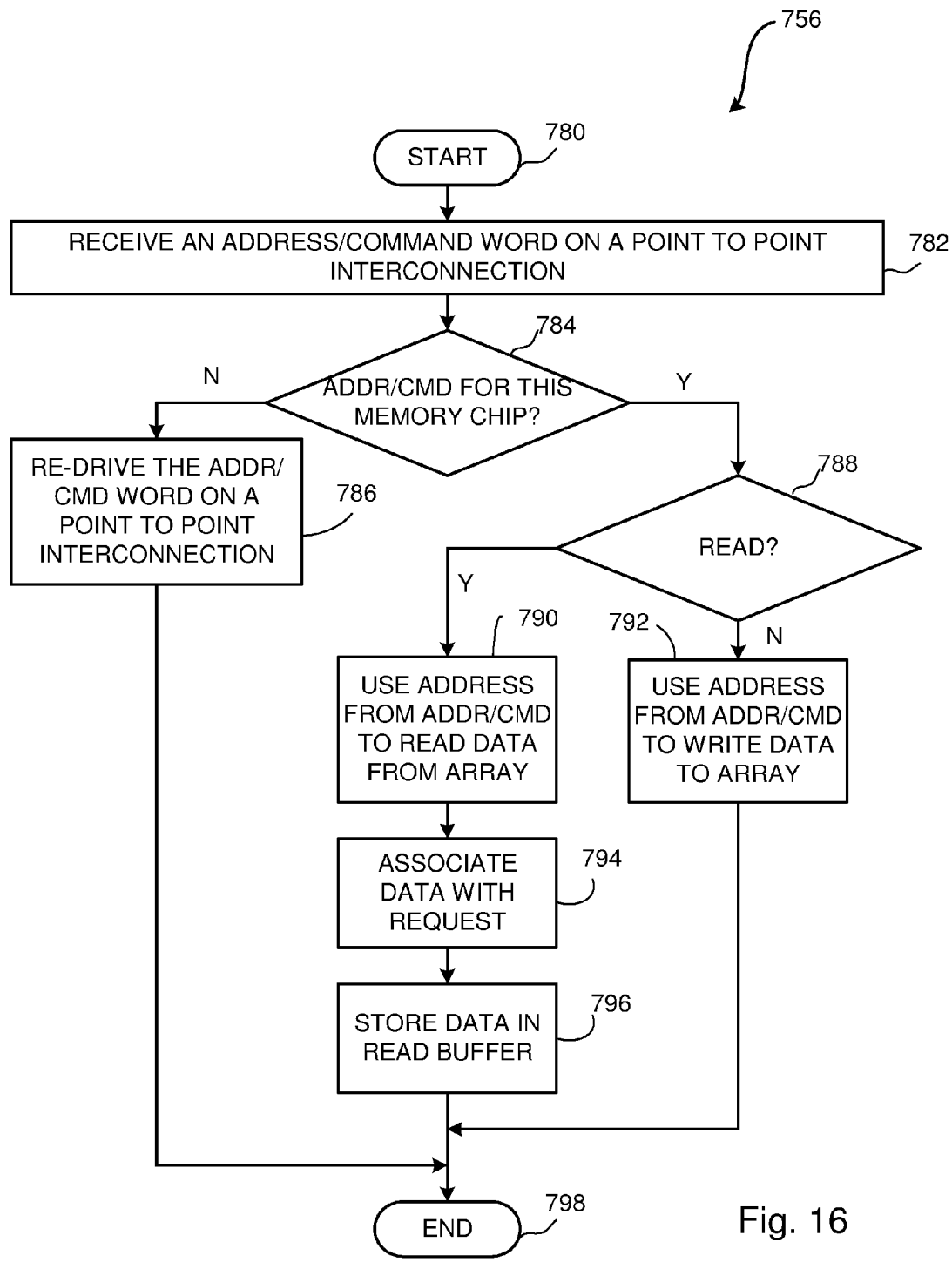
FIG. 16 is a more detailed flowchart of a method performed by a memory chip according to an embodiment of the invention.

FIG. 16 shows a more detailed flow chart of step 756. Step 780 starts method 756. Step 782 receives an address/command word on a point to point link of the address/command bus chain (FIG. 4, address/command bus 58X).

Step 784 checks to see if the present address/command word is for the present memory chip. In an embodiment explained supra with reference to FIG. 6A in which the address command bus is one bit wide, if the first bit received is a "1", the address/command word is for the present memory chip. In embodiments in which the address/command bus is more than one bit wide, the chip ID is checked against a memory chip ID with various implementations of a logical comparison (FIG. 6D, chip ID compare 87).

If the address/command word is not for the present memory chip, control passes to step 786, which re-drives the address/command word on a point to point interconnection link (FIG. 4, address/command bus 58Y) to a next chip in the daisy chain of memory chips. In the embodiment described with reference to FIG. 6A, the chip ID field of the address/command word is shifted right by one bit position.

If step 784 determines that the address/command word is directed to the present chip, control passes to step 788. Step 788 looks at a command field in the address/command word and determines if the address/command word is for a read or a write. If the address/command word is for a read, control passes to step 790. Step 790 uses address information in the address/command word to make a read access to an array on the memory chip. In an embodiment explained earlier, array timings are self timed, so that a relatively faster chip will be accessed faster than a relatively slow chip. In another embodiment also explained earlier, memory timings are transmitted on a timing signal chain through the daisy chain of memory chips.

In step 794 read data is associated with a packet ID of the address/command word to make a data word that can be transmitted back to the memory controller.

In step 796 the read data word is placed in a read data buffer and is transmitted on a data bus point to point link in the direction of the memory controller when the data bus link is available.

Steps 794 and 796 are not required in embodiments of the invention where the memory controller manages transmission of address/command words in such a way as to guarantee in-order return of data words.

If step 788 determines that the address/command word is a write data word, data is written into an array on the memory chip. In an embodiment, the data written into the array was transmitted as part of the address/command word (See FIG. 5B). In another embodiment, the data was transmitted down the data bus chain by the memory controller and was associated on the present chip (e.g., by a chip ID in the write data word, or by matching a packet ID in the write data word) with the associated address/command word).

Figure 17:
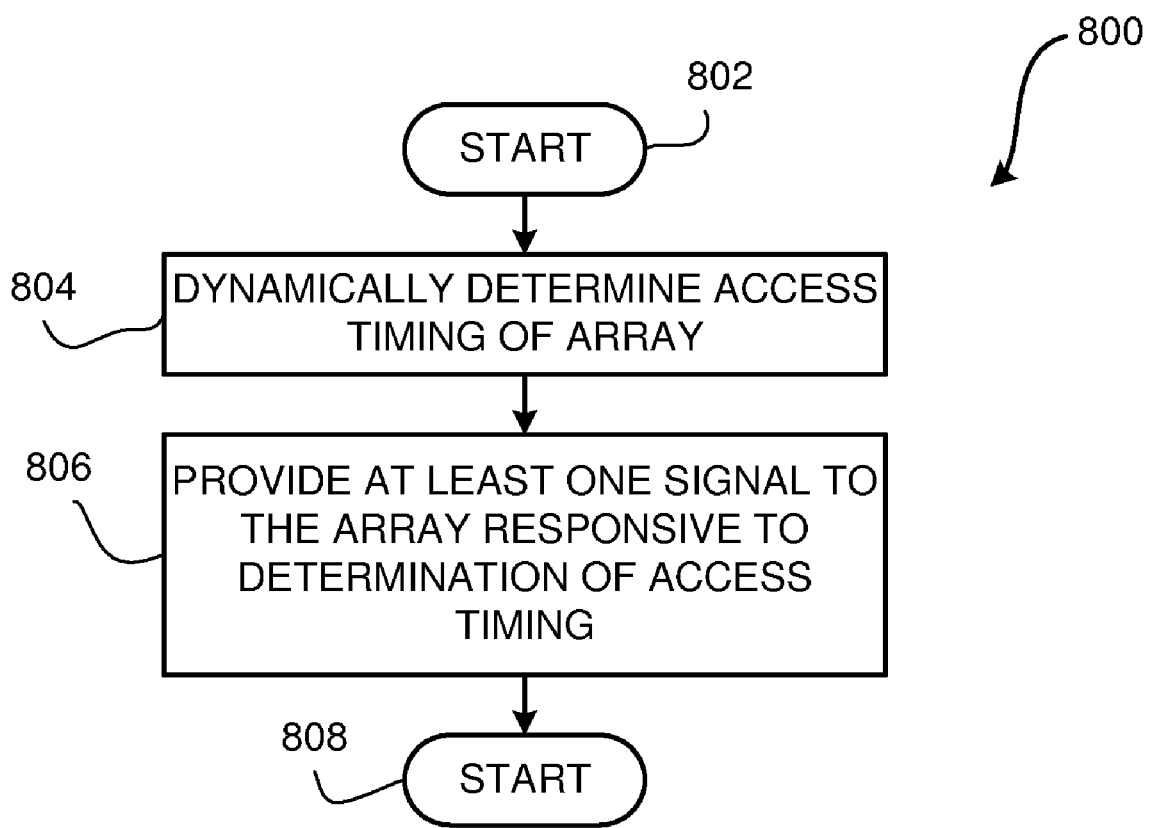
FIG. 17 is a flowchart of a self timing method according to an embodiment of the invention.

Method 800 is depicted in FIG. 17. Method 800, in brief, provides for self timing of an array on a memory chip. Self timing eliminates a need to provide external control (e.g., from a memory controller) of array timing on a memory chip. Self timing also allows each memory chip in the daisy chain of memory chips to access an array at a speed appropriate for the array on each memory chip. Step 802 begins the method.

Step 804 dynamically determines permissible access timing of an array on a memory chip. Access timings of an array are determined by process variations in a semiconductor process that produced the memory chip; current voltage conditions; and current temperature of the memory chip. FIGS. 9B, 10, 11A, and 11B provide apparatus in detail sufficient for one of ordinary skill in the art to construct a self time circuit that produces self timing for the array. The step includes running a ring oscillator having a frequency determined by a dynamic circuit that tracks actual access times of the array. Step 806 comprises using the ring oscillator frequency to produce timing signals and controlling the array with those timing signals.

Embodiments of the invention explained above provide a very high performing memory system 270. Other embodiments are possible that, while performing at a lower speed, require less logic on memory chips 54. In brief, memory controller 52, in such embodiments, is responsible for ensuring that data is received in order and that no "collisions" on any data bus 59 link can occur. That is, when a first read request is sent to a memory chip 54 on a first address/command word 120, and a second read request is sent to a memory chip 54 on a second address/command word 120, a first data word 130 that corresponds to the first address/command word 120 is guaranteed to arrive at memory controller 52 before a second data word 130 that corresponds to the second address/command word 120 arrives at memory controller 52. To accomplish this, memory controller must know how long it takes for an address/command word 120 to propagate down the address/command bus 58 chain, and access times for each memory chip 54 in the daisy chain of memory chips 47.

Embodiments of an address/command word 120, a data word 130, and a memory controller 52 suitable for an embodiment of the invention suitable for a memory system 270 in which all timings are enforced by memory controller 52 is shown in FIGS. 18A, 18B, and 18C. Such embodiments will be called "simplified memory chip embodiments".

FIG. 18A shows an address/command word 120, suitable for a simplified memory chip embodiment, having command 122 as the first field, that is, the first information from address/command word 120 sent by memory controller 52. Address 125 comprises a physical address, a portion of which (i.e., a number of high order bits in the physical address) determines which memory chip 54 in a daisy chain of memory chips 47 the address/command word 120 is directed to. In the embodiment of FIG. 18A, data 131 to be written to a memory chip 54 is sent as part of address/command word 120 as explained earlier. A CRC 125 field is included in embodiments requiring the additional data integrity offered by CRC data. Command 122 as the first information received by each memory chip 54 in a daisy chain of memory chips 47 tells the each memory chip 54 if data 131 is a portion of a particular address/command word 120 (i.e., if command 122 is for a "write") or if data 131 is not a portion of a particular address/command word 120 (i.e., if command 122 is for a "read"). No packet ID is required because, in the simplified memory chip embodiment being discussed, memory controller 52 enforces timings such that there is no ambiguity regarding an address/command word 120 and a data word 130.

FIG. 18B shows a data word 130 appropriate for the simplified memory chip embodiment being discussed. As above, no packet ID 132 is required. Only data 131 and CRC 135 (in embodiments implementing CRC) are used.

FIG. 18C shows a memory controller 52 that enforces timings such that no ambiguities exist between an address/command word 120 and a data word 130. Like referenced items function as explained in reference to FIG. 13. Sequencer 612 knows how fast address/command words 120 are transmitted and how fast data words 130 are transmitted. Sequencer 621 knows how many signal conductors in address/command bus 58 (e.g., scanned in at startup of computer system 250); and a length of an address/command word 120 (e.g., scanned in at startup of computer system 250), and therefore knows how many cycles are required to send an address/command word 120. Sequencer 621 also knows how long each memory chip 54 in a daisy chain of memory chips takes to re-drive an address/command word 120. Similarly, sequencer 621 knows how many signal conductors are in data bus 59, and various timing requirements associated with data bus 59, such as time to receive data, time to re-drive data. Sequencer 621 also knows how long a memory chip 54 takes to access (i.e., read or write) an array on a memory chip 54. Sequencer 621 controls address/command generator 640 to transmit address/command words 120 at times that guarantee that reads will be returned in the proper order (i.e., first read data words 130 will arrive in the order of address/command words 120.

In the simplified memory chip embodiment being discussed, (See FIG. 6A) address/command queue 81 in address/command 80 on each memory chip is simply a single address/command buffer 82. Referring to FIG. 7A as implemented for a simplified memory chip embodiment, Read queue 141 is a simple buffer (register) and add packet 142 is not needed. Write queue 145 is a simple buffer. Write queue 146 is not needed, since data 131 is sent with address/command words 120. Read queue 147 is not needed, since data logic 100 simply re-drives data words 130 from data bus link 59Y to data bus link 59X. Data bus 59 is assumed to be unidirectional, in the direction of memory controller 52, so no apportioning of data bus 59 into an "incoming portion" and an "outgoing portion" is needed.

FIG. 6B will be used to illustrate how sequencer 621 operates. Assume now that each address/command bus 58 link has four signal conductors. It will be understood that, if "single ended" transmission is implemented, a signal conductor is just one "wire"; if differential transmission is implemented, a signal conductor has two wires. The following assumptions are shown in Table 1, for exemplary purposes:

TABLE 1

| Assumption | Description |
| --- | --- |
| 0.2 ns | Address/command bus beat |
| 0.2 ns | Memory chip receive |
| 0.2 ns | Memory chip time to recognize chip ID Address portion |
| 0.2 ns | Memory chip re-drive on address/command bus |
| 30 ns | Access time on memory chip |
| 0.2 ns | Data bus beat |
| 0.2 ns | Memory chip receive time from data bus |
| 0.2 ns | Memory chip re-drive on data bus |
| 24 bits | Length of Address/command word for read |
| 4 bits | Number of signal conductors in address/command bus |
| 64 bits | Data word length |
| 8 bits | Number of signal conductors in data bus |
| 31.6–33.2 ns | First & last data transfer from first chip from a/c word |
| 32.2–33.8 ns | First & last data transfer from second chip from a/c word |
| 32.8–34.4 ns | First & last data transfer from third chip from a/c word |
| 33.4–35.0 ns | First & last data transfer from fourth chip from a/c word |

TABLE 2

| | Last Access to | | | |
| --- | --- | --- | --- | --- |
| Read from | Chip 1 | Chip 2 | Chip 3 | Chip 4 |
| Chip 1 | 30 ns | 2.6 ns | 3.6 ns | 4.6 ns |
| Chip 2 | 1.2 ns | 30 ns | 2.6 ns | 3.6 ns |
| Chip 3 | −0.2 ns | 0.8 ns | 30 ns | 0.8 ns |
| Chip 4 | −1.2 ns | −0.2 ns | 0.8 ns | 30 ns |

The timings of first and last data transfer from memory chips 1-4 shown in Table 1 are measured from transmission by memory controller 52 of an address/command word 120 having a read command.

Table 2 gives required timings for issuance of an address/command word 120 by memory controller 52 (i.e., timed by sequencer 621 in FIG. 18C). For example, accesses to a particular chip (in the simplified memory chip embodiment being discussed now) cannot occur faster than 30 ns, because the access time of each chip is assumed to be 30 ns, and there is no queuing in memory chips 54 in the simplified memory chip embodiment. However, if an access were made to chip 1 at 0.0 ns (i.e., a first memory chip 54 in the daisy chain of memory chips 47) an address/command word 120 can be launched by memory controller 52 at 1.2 ns. Note that, in the example, that if a first data word 130 is to be read from chip 1, and a subsequent data word is to be read from chip 4, there is a −1.2 ns timing requirement. Note that transmission of a 24-bit data word 120 requires six beats on the address/command bus 58 at 0.2 ns/beat in the example, or 1.2 ns to transmit an address/command word 120. Sequencer 121 therefore can not transmit the address/command word 120 to the fourth chip out of sequence before transmitting the address/command word 120 to the first chip, as a collision would occur between a first beat of data transmission from the first memory chip 54 and a last beat of data transmission from the fourth memory chip 54. However, if (using the same assumptions) the daisy chain of memory chips 47 had more memory chips, sequencer 621 could transmit address/command words 120 out of order in some cases, with data words 130 arriving in order.

It will be understood that the above example is simplified for explanation. Further timing requirements by sequencer 621, such as reads after writes (note that write address/command words have a data 131 field, for example) must be accommodated. In general, read access and write access times are not the same for a particular memory chip 54. The example is used to illustrate that memory chip 52, in an embodiment, is capable of issuing address/command words timed to avoid collisions on data bus 130.

The simplified memory chip embodiment being discussed is also applicable to a daisy chain of memory chips 47 in which the memory chips 54 are self timed as described earlier. However, sequencer 621 must have data from each self timed memory chip 54 regarding current access timing of the arrays 55 on each self timed memory chip 54. In an embodiment, memory controller 52 transmits, on a periodic basis (a calibration of access timing information), an address/command word 120 having a command (command 122, shown in FIGS. 5A, 5B) that causes the memory chip 54 to which the address/command word 120 is directed, to create one or more data words 130 having access timing information, and to transmit the one or more data words 130 having the access timing information to memory controller 52. In an embodiment, address/command words 120 for reads and writes are suspended during the calibration of access timing information. Sequencer 621 uses the access timing information to adjust when address/command words 120 are transmitted.

In an alternative embodiment, memory controller 52 suspends transmission of address/command words 120 resultant from requests for reads and writes from processor 200. Memory controller 52 creates a particular address/command word 120 with a calibrate command in command 122 and transmits the particular address/command word to the daisy chain of memory chips, receives a responsive data word 130, storing the time from transmission of the particular address/command word 120 to the reception of the responsive data word 130. Memory controller 52 uses information (e.g., chip ID) as to which memory chip 54 in the daisy chain of memory chips 47 was addressed. Memory controller 52 also has information as to lengths of address/command word 120 and data word 130 and frequency and width of address/control bus 58 and data bus 59. From this information, memory controller can compute the array access time (for example, array access time is the total time minus total transmission time). Array access time may be different for a read versus a write. Self timed memory chip 54, on a write, must transmit a data word 130 back to memory controller 52 to acknowledge completion of a write access to array 55 on the self timed memory chip 54.

What is claimed is:

1. A memory chip comprising:
a first input configured to receive an address/command word;
a first output configured to drive an address/command word;
circuitry configured to determine from contents of the address/command word if the address/command word is directed to the memory chip;
an array capable of storing data; and
a self time block configured to determine a performance of the array and to drive a timing signal to the array, the timing signal responsive to the determination of the performance of the array;
wherein
the memory chip is configured to make a read from or write to the array for address/command words determined to be directed to the memory chip; if the address/command word is determined to not be directed to memory chip, the memory chip is configured to re-drive the address/command word onto the first output; if the address/command word is determined to be directed to the memory chip, the memory chip is configured to not re-drive the address/command word onto the first output;
the self time block further comprising a ring oscillator having a frequency that tracks an access time of the array;
the self time block further comprising:
a counter having a plurality of bits, the counter configured to count responsive to a first clock, the counter being reset by a first value of an output of the ring oscillator;
a register configured to receive a value of the counter when the output of the ring oscillator transitions to the first value; and
a decode that decodes a value in the register and produces a self timing signal coupled to the array, the array configured to use the self timing signal to time at least a portion of an access to the array.

2. The memory chip of claim 1 further comprising:
a second input configured to receive a bus clock, the bus clock used by the memory chip to receive the address/command word and to re-drive the address/command word; and
a second output configured to re-drive the bus clock.

3. The memory chip of claim 2, further comprising a phase locked loop circuit configured to convert a first frequency of the bus clock into a second frequency, the second frequency used to receive the address/command word and to re-drive the address/command word.

4. The memory chip of claim 3 further comprising a first data bus port configured to receive a first data word.

5. The memory chip of claim 4 further comprising a second data bus port configured to re-drive the first data word.

6. The memory chip of claim 5, the second data bus port further configured to receive a second data word.

7. The memory chip of claim 6, the first data bus port further configured to re-drive the second data word.

8. The memory chip of claim 7 in which all I/Os in the first data bus port are configured to be bidirectional I/Os.

9. The memory chip of claim 8 in which all I/Os in the second data bus port are configured to be bidirectional I/Os.

10. The memory chip of claim 9 in which a first portion of I/Os in the first data bus port are configured to be receivers and a second portion of I/Os in the first data bus port are configured to be drivers.

11. The memory chip of claim 10 in which a first portion of I/Os in the second data bus port are configured to be receivers and a second portion of I/Os in the second data bus port are configured to be drivers.

12. The memory chip of claim 7, further comprising:
a first read queue to store data read from the array; and
a first write queue to store data to be written to the array.

13. The memory chip of claim 12 wherein the memory chip is configured to associate an address/command word received with data received from the first data bus port.

14. The memory chip of claim 7, further comprising:
a second read queue to store data received from the second data bus port; and
a second write queue to store data to be re-driven to the second data bus port.

15. The memory chip of claim 14 wherein the memory chip is configured to select data from the first read queue or data from the second read queue and drive the selected data onto the first data bus port.

16. The memory chip of claim 14 wherein the memory chip is configured to re-drive data from the second write queue onto the second data bus port.

17. The memory chip of claim 1 wherein the first input receives a single bit of data at a time;
wherein the address/command word comprises a chip ID field in a leading position; and
wherein the memory chip configured to check if a first bit in the chip ID field has a first logical value; if so, the memory chip is configured to store the address/command work on the memory chip; if the first bit in the chip ID field has a second logical value, the memory chip is configured to re-drive the address/command word on the first output with the chip ID field shifted by one bit, with the first bit in the chip ID field being discarded, and a second bit in the chip ID field becoming a new first bit in the chip ID field.

18. The memory chip of claim 17 wherein the address/command word re-drive onto the first output begins one cycle of transmission of the first input after the first bit in the chip ID field is received from the first input if the first bit in the chip ID field is the second logical value.

19. The memory chip of claim 1, wherein the address/command word contains data to be written to the array if the address/command word is determined to be directed to the memory chip.

* * * * *